United States Patent
Noh et al.

(10) Patent No.: US 11,258,535 B2
(45) Date of Patent: Feb. 22, 2022

(54) METHOD AND APPARATUS FOR TRANSMITTING INFORMATION

(71) Applicant: LG Electronics Inc., Seoul (KR)

(72) Inventors: Kwangseok Noh, Seoul (KR); Bonghoe Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 12 days.

(21) Appl. No.: 16/623,283

(22) PCT Filed: Jun. 18, 2018

(86) PCT No.: PCT/KR2018/006826
§ 371 (c)(1),
(2) Date: Dec. 16, 2019

(87) PCT Pub. No.: WO2018/231026
PCT Pub. Date: Dec. 20, 2018

(65) Prior Publication Data
US 2020/0186284 A1 Jun. 11, 2020

Related U.S. Application Data

(60) Provisional application No. 62/567,220, filed on Oct. 2, 2017, provisional application No. 62/546,522, filed
(Continued)

(51) Int. Cl.
*H04W 72/04* (2009.01)
*H04L 1/00* (2006.01)

(52) U.S. Cl.
CPC .......... *H04L 1/0057* (2013.01); *H04L 1/0067* (2013.01); *H04W 72/048* (2013.01)

(58) Field of Classification Search
CPC .. H03M 13/27; H03M 13/13; H03M 13/2792; H03M 13/451; H03M 13/6362;
(Continued)

(56) References Cited

U.S. PATENT DOCUMENTS 6,744,744 B1 * 6/2004 Tong ..................... H03M 13/00
370/320
10,148,289 B2 * 12/2018 Shen ..................... H04L 1/0057
(Continued)

FOREIGN PATENT DOCUMENTS

| KR | 20150099396 | 8/2015 |
| KR | 20150115950 | 10/2015 |
| KR | 20150134257 | 12/2015 |

OTHER PUBLICATIONS

PCT International Search Report and Written Opinion in International Application No. PCT/KR2018/006826, dated Sep. 10, 2018, 23 pages (with English translation).

*Primary Examiner* — Phuc H Tran
(74) *Attorney, Agent, or Firm* — Fish & Richardson P.C.

(57) ABSTRACT

A transmission apparatus: encodes information into a first bit sequence, using a polar code; outputs a second bit sequence by inputting the first bit sequence to an interleaver; modulates the second bit sequence into modulation symbols according to a modulation order; and transmits the modulation symbols. The interleaver: has an odd number of columns; and is configured to cyclically read and output, from column k, bits stored in row n of the interleaver, and cyclically read and output, from column k+a, bits stored in row n+1 of the interleaver, wherein a represents an integer which is not 0.

10 Claims, 18 Drawing Sheets

Related U.S. Application Data on Aug. 16, 2017, provisional application No. 62/522,082, filed on Jun. 19, 2017, provisional application No. 62/521,360, filed on Jun. 16, 2017, provisional application No. 62/520,559, filed on Jun. 16, 2017.

(58) Field of Classification Search
CPC .... H03M 13/09; H03M 13/618; H03M 13/15; H03M 13/2906; H03M 13/2957; H03M 13/63; H03M 13/6502; H03M 13/2707; H03M 13/271; H03M 13/616; H04L 1/00; H04L 1/0057; H04L 1/0067; H04L 1/0071; H04L 1/0045; H04L 1/0041; H04L 1/0007; H04L 1/0008; H04L 1/0009; H04L 1/0058; H04L 1/0064; H04L 1/0068; H04L 1/0061; H04L 1/0072; H04W 72/048
See application file for complete search history.

(56) References Cited

U.S. PATENT DOCUMENTS

| | | | |
|---|---|---|---|
| 2004/0199847 A1* | 10/2004 | Calabro | H03M 13/2721 714/755 |
| 2015/0244398 A1* | 8/2015 | Mouhouche | H03M 13/255 714/776 |
| 2016/0072526 A1* | 3/2016 | Cheng | H03M 13/2732 714/776 |
| 2016/0261371 A1* | 9/2016 | Klenner | H03M 13/1185 |
| 2017/0317868 A1* | 11/2017 | Lin | H04L 47/34 |
| 2018/0331693 A1* | 11/2018 | Lou | H04L 1/0061 |

* cited by examiner

☐ : systematic bit   ▦ : RV point
▨ : Parity 0         ▧ : Parity 1

(a)                    (b)

(a)

(b)

(a) Memory writing order (b) Memory reading order (c) Memory reading order (a) Memory writing order Reading start position (b) Memory reading order (a) Memory writing order (b) Memory reading order (c) Memory reading order

FIG. 14

| N | K | R | Natural | Random | Triangle | Left_plus_1 | Left_minus_1 | Right_plus_1 | Right_minus_1 |
|---|---|---|---|---|---|---|---|---|---|
| 512 | 85 | 1/6 | 3.253724 | 0.84184 | 0.889535 | 1.262584 | 1.040055 | 1.04454 | 0.887546 |
| | 170 | 1/3 | 6.491765 | 4.799694 | 4.828081 | 4.930265 | 4.829067 | 4.833974 | 4.936891 |
| | 256 | 1/2 | 8.739352 | 7.904694 | 7.835757 | 7.910617 | 7.778957 | 7.847488 | 7.88955 |
| 256 | 43 | 1/6 | 2.854903 | 1.045751 | 1.030618 | 1.107699 | 1.000705 | 1.109959 | 1.078383 |
| | 85 | 1/3 | 6.2591 | 4.852005 | 4.912907 | 4.988852 | 4.873385 | 4.955157 | 5.06754 |
| | 128 | 1/2 | 8.53503 | 7.922819 | 7.982416 | 7.990107 | 7.929389 | 7.940126 | 8.040997 |
| 128 | 21 | 1/6 | 3.623854 | 3.326658 | 3.404085 | 3.435591 | 3.416577 | 3.387479 | 3.428073 |
| | 43 | 1/3 | 6.172512 | 5.141504 | 5.119247 | 5.125161 | 5.022208 | 5.185598 | 5.100575 |
| | 64 | 1/2 | 8.441009 | 8.129998 | 8.123569 | 8.128144 | 8.078914 | 8.190692 | 8.050944 |
| 64 | 21 | 1/3 | 6.041905 | 5.782448 | 5.874869 | 5.992261 | 5.865313 | 5.846639 | 5.779472 |
| | 32 | 1/2 | 8.527509 | 8.030651 | 8.098076 | 8.185216 | 8.041109 | 7.899617 | 8.089231 |

FIG. 15

| R | K | M | Natural | Random | Triangle | Left_plus_1 | Left_minus_1 | Right_plus_1 | Right_minus_1 |
|---|---|---|---------|--------|----------|-------------|--------------|--------------|---------------|
| 1/6 | 48 | 288 | 1.958848 | 1.045962 | 1.150954 | 1.308423 | 1.09861 | 1.248591 | 0.990514 |
| | 64 | 382 | 1.520565 | 0.993778 | 1.116622 | 1.167708 | 1.258655 | 1.113848 | 1.100693 |
| | 120 | 720 | 1.964149 | 0.917549 | 0.811028 | 1.96817 | 0.843152 | 1.005557 | 0.875298 |
| 1/3 | 48 | 144 | 6.179223 | 5.826594 | 5.898315 | 6.113857 | 5.710479 | 5.930849 | 5.866277 |
| | 64 | 192 | 6.038796 | 5.191977 | 5.261143 | 5.331478 | 5.221935 | 5.248335 | 5.973844 |
| | 120 | 360 | 5.662775 | 5.38641 | 5.427646 | 5.378347 | 5.458071 | 5.497112 | 5.447068 |
| | 200 | 600 | 7.049397 | 7.230683 | 7.575284 | 7.47362 | 7.726007 | 7.510326 | 7.653614 |
| 1/2 | 48 | 96 | 8.443607 | 8.332796 | 8.474493 | 8.449679 | 8.592174 | 8.596101 | 8.416913 |
| | 64 | 128 | 8.441009 | 8.187474 | 8.123569 | 8.128144 | 8.078914 | 8.190692 | 8.050944 |
| | 120 | 240 | 8.337963 | 8.159021 | 8.17381 | 8.086087 | 8.262332 | 8.000934 | 8.12245 |

FIG. 16

| R | K | M | Natural | Random | Triangle | Left_plus_1 | Left_minus_1 | Right_plus_1 | Right_minus_1 |
|---|---|---|---|---|---|---|---|---|---|
| 1/6 | 48 | 288 | 6.431211 | 4.964907 | 5.020271 | 4.922447 | 5.338412 | 4.781826 | 4.972388 |
|  | 64 | 382 | 1.926307 | 1.266399 | 1.27363 | 1.284679 | 1.418717 | 1.321917 | 1.291502 |
|  | 120 | 720 | 4.03921 | 4.259698 | 4.646182 | 4.226528 | 3.632633 | 4.321 | 4.27675 |
| 1/3 | 64 | 192 | 6.55182 | 5.623945 | 5.557214 | 5.51121 | 5.545129 | 5.447227 | 6.454737 |
|  | 48 | 96 |  | 8.332906 | 8.522552 | 8.230489 | 8.703079 | 8.488095 | 8.432923 |
| 1/2 | 64 | 128 | 8.441009 | 8.187474 | 8.123569 | 8.128144 | 8.078914 | 8.190692 | 8.050944 |
|  | 120 | 240 | 8.382384 | 8.253231 | 8.35124 | 8.60434 | 8.336143 | 8.293771 | 8.416115 |

(a)

(b)

(a)

(b)

(c)

METHOD AND APPARATUS FOR TRANSMITTING INFORMATION

CROSS-REFERENCE TO RELATED APPLICATIONS

This application is a National Stage application under 35 U.S.C. § 371 of International Application No. PCT/KR2018/006826, filed on Jun. 18, 2018, which claims the benefit of U.S. Provisional Application No. 62/567,220, filed on Oct. 2, 2017, U.S. Provisional Application No. 62/546,522, filed on Aug. 16, 2017, U.S. Provisional Application No. 62/522,082, filed on Jun. 19, 2017, U.S. Provisional Application No. 62/521,360, filed on Jun. 16, 2017, and U.S. Provisional Application No. 62/520,559, filed on Jun. 16, 2017. The disclosures of the prior applications are incorporated by reference in their entirety.

TECHNICAL FIELD

The present disclosure relates to a wireless communication system and, more particularly, to a method and apparatus for transmitting information.

BACKGROUND ART

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

DISCLOSURE

Technical Problem

Due to introduction of new radio communication technology, the number of user equipments (UEs) to which a BS should provide a service in a prescribed resource region increases and the amount of data and control information that the BS should transmit to the UEs increases. Since the amount of resources available to the BS for communication with the UE(s) is limited, a new method in which the BS efficiently receives/transmits uplink/downlink data and/or uplink/downlink control information using the limited radio resources is needed. In other words, as the density of nodes and/or the density of UEs increases, a method of efficiently using high-density nodes or high-density UEs for communication is needed.

With development of technologies, overcoming delay or latency has become an important challenge. Applications whose performance critically depends on delay/latency are increasing. Accordingly, a method to reduce delay/latency compared to the legacy system is demanded.

When polar codes are used for channel coding, performance deterioration according to a modulation order, due to characteristics of the polar codes, may be prevented and a method of preventing such performance deterioration is needed.

Generally, the size of a polar code is remarkably large as compared with other codes used for channel coding. Therefore, when an interleaver is used for bits obtained using the polar code, latency may increase.

The technical objects that can be achieved through the present disclosure are not limited to what has been particularly described hereinabove and other technical objects not described herein will be more clearly understood by persons skilled in the art from the following detailed description.

Technical Solution

According to an aspect of the present disclosure, provided herein is a method of transmitting information by a transmitting device in a wireless communication system. The method includes encoding the information to a first bit sequence using a polar code; outputting a second bit sequence by inputting the first bit sequence to an interleaver; modulating the second bit sequence to modulation symbols according to a modulation order; and transmitting the modulation symbols. The interleaver has an odd number of columns. The interleaver outputs bits stored in a row n of the interleaver by cyclically reading out the bits starting from a column k and outputs bits stored in a row n+1 of the interleaver by cyclically reading out the bits starting from a column k+a, where a is an integer other than 0.

According to an aspect of the present disclosure, provided herein is a transmitting device for transmitting information in a wireless communication system. The transmitting device includes: an encoder configured to encode the information to a first bit sequence using a polar code; an interleaver configured to output a second bit sequence based on the first bit sequence to an interleaver; a modulation mapper configured to modulate the second bit sequence to modulation symbols according to a modulation order; and a transceiver configured to transmit the modulation symbols. The interleaver is configured to have an odd number of columns. The interleaver is configured to output bits stored in a row n of the interleaver by cyclically reading out the bits starting from a column k and output bits stored in a row n+1 of the interleaver by cyclically reading out the bits starting from a column k+a, where a is an integer other than 0.

In each aspect of the present disclosure, the interleaver may sequentially store bits of the first bit sequence in a column-first direction starting from the first column of the interleaver.

In each aspect of the present disclosure, the number C of columns of the interleaver may be 'Q−b' or 'Q+b', where Q is the modulation order and b is an odd number not greater than Q.

In each aspect of the present disclosure, the number R of rows of the interleaver may be ceil(M/C), where M is the length of the first bit sequence and C is the number of columns of the interleaver.

In each aspect of the present disclosure, the transmission module may further include a rate matching module.

In each aspect of the present disclosure, the rate matching module may be configured to rate-match the first bit sequence and input the rate-matched first bit sequence to the interleaver.

In each aspect of the present disclosure, the rate matching module may be configured to rate-match the second bit sequence and input the rate-matched second bit sequence to the modulation mapper.

The above technical solutions are merely some parts of the examples of the present disclosure and various examples into which the technical features of the present disclosure are incorporated can be derived and understood by persons skilled in the art from the following detailed description of the present disclosure.

Advantageous Effects

According to example(s) of the present disclosure, uplink/downlink signals can be efficiently transmitted/received. Therefore, overall throughput of a radio communication system can be improved.

In addition, signals can be transmitted/received efficiently and at a low error rate in a wireless communication system.

According to the present disclosure, when a polar code is used for channel coding, performance deterioration of channel coding can be prevented even when a modulation order is high.

According to the present disclosure, latency can be reduced even when interleaving is used for a polar code.

It will be appreciated by persons skilled in the art that that the effects that can be achieved through the present disclosure are not limited to what has been particularly described hereinabove and other advantages of the present disclosure will be more clearly understood from the following detailed description.

BRIEF DESCRIPTION OF THE DRAWINGS

The accompanying drawings, which are included to provide a further understanding of the disclosure, illustrate examples of the disclosure and together with the description serve to explain the principle of the disclosure.

FIG. 14 illustrates a required signal-to-noise ratio (SNR) (target BLER=$10^{-2}$) of mother code sizes to avoid an influence of rate matching FIG. 15 illustrates a required SNR (target BLER=$10^{-2}$) according to an interleaver considering a bit-reversal shortening scheme.

FIG. 16 illustrates a required SNR for bit-reverse (BR) puncturing

MODE FOR CARRYING OUT THE INVENTION

Figure 1:
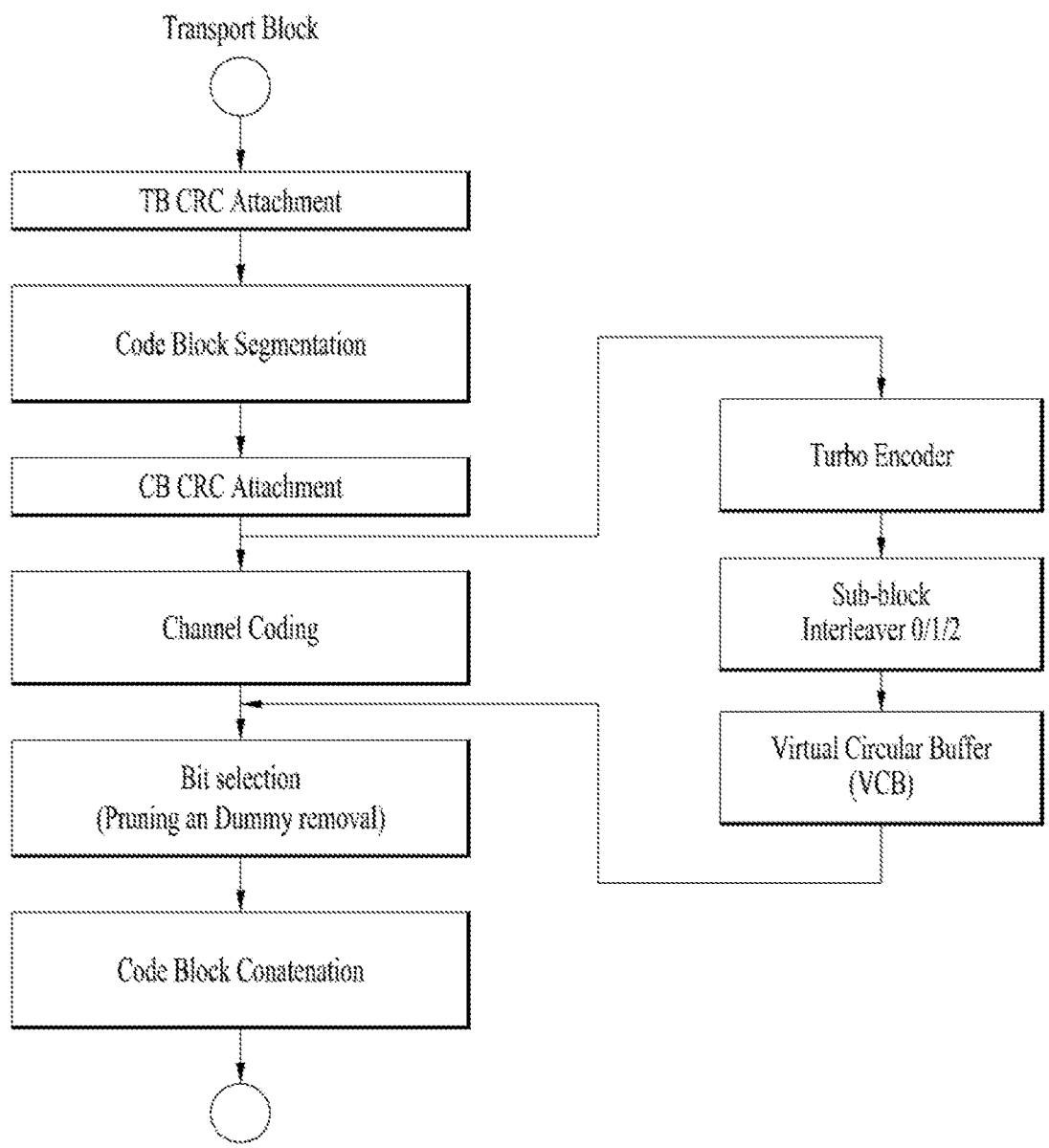
FIG. 1 illustrates a transport block processing procedure in an LTE/LTE-A system.

Reference will now be made in detail to the exemplary examples of the present disclosure, examples of which are illustrated in the accompanying drawings. The detailed description, which will be given below with reference to the accompanying drawings, is intended to explain exemplary examples of the present disclosure, rather than to show the only examples that can be implemented according to the disclosure. The following detailed description includes specific details in order to provide a thorough understanding of the present disclosure. However, it will be apparent to those skilled in the art that the present disclosure may be practiced without such specific details.

In some instances, known structures and devices are omitted or are shown in block diagram form, focusing on important features of the structures and devices, so as not to obscure the concept of the present disclosure. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present disclosure is applied to 3GPP based communication system, e.g. LTE/LTE-A, NR. However, the technical features of the present disclosure are not limited thereto. For example, although the following detailed description is given based on a mobile communication system corresponding to a 3GPP LTE/LTE-A/NR system, aspects of the present disclosure that are not specific to 3GPP LTE/LTE-A/NR are applicable to other mobile communication systems.

In examples of the present disclosure described below, the expression that "assumes" may mean that a subject which transmits a channel transmits the channel in accordance with the corresponding "assumption". This may also mean that a subject which receives the channel receives or decodes the channel in a form conforming to the "assumption", on the assumption that the channel has been transmitted according to the "assumption".

In the present disclosure, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a base station will be referred to as an eNB.

In the present disclosure, a node refers to a fixed point capable of transmitting/receiving a radio signal through communication with a UE. Various types of eNBs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be an eNB. For example, the node may be a radio remote head (RRH) or a radio remote unit (RRU). The RRH or RRU generally has a lower power level than a power level of an eNB. Since the RRH or RRU (hereinafter, RRH/RRU) is generally connected to the eNB through a dedicated line such as an optical cable, cooperative communication between RRH/RRU and the eNB can be smoothly performed in comparison with cooperative communication between eNBs connected by a radio line. At least one antenna is installed per node. The antenna may mean a physical antenna or mean an antenna port or a virtual antenna.

In the present disclosure, a cell refers to a prescribed geographical area to which one or more nodes provide a communication service. Accordingly, in the present disclosure, communicating with a specific cell may mean communicating with an eNB or a node which provides a communication service to the specific cell. In addition, a DL/UL signal of a specific cell refers to a DL/UL signal from/to an eNB or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between an eNB or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency may be the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both an eNB and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present disclosure, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present disclosure, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present disclosure, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of an eNB is conceptually identical to downlink data/DCI transmission on PDCCH/PCFICH/PHICH/PDSCH, respectively.

For terms and technologies which are not described in detail in the present disclosure, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.211, 3GPP TS 38.212, 3GPP TS 38.213, 3GPP TS 38.214, 3GPP TS 38.300 and 3GPP TS 38.331. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present disclosure, the corresponding technology is referred to as a new RAT (NR) or 5G RAT, for convenience.

An NR communication system demands that much better performance than a legacy fourth generation (4G) system be supported in terms of data rate, capacity, latency, energy consumption, and cost. Accordingly, the NR system needs to make progress in terms of bandwidth, spectrum, energy, signaling efficiency, and cost per bit. NR needs to use efficient waveforms in order to satisfy these requirements.

FIG. 1 illustrates a transport block processing procedure in an LTE/LTE-A system.

In order for a receiving side to correct errors that signals experience in a channel, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of a maximum of two transport blocks every transmission time interval (TTI) in each DL/UL cell. The following coding steps may be applied to each transport block of the DL/UL cell:

cyclic redundancy check (CRC) attachment to a transport block;
code block segmentation and CRC attachment to a code block;
channel coding;
rate matching; and
code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, if the amount of radio resources, i.e., the number of transmission bits capable of being transmitted on the radio resources, is M and if a coded bit sequence, i.e., the number of output bits of the encoder, is N, in which M is different from N, then rate matching is performed to match the length of the coded bit sequence to M. If M>N, then all or a part of bits of the coded bit sequence are repeated to match the length of the rate-matched sequence to M. If M<N, then a part of the bits of the coded bit sequence is punctured to match the length of the rate-matched sequence to M and the punctured bits are excluded from transmission.

Namely, in an LTE/LTE-A system, after data to be transmitted is encoded using channel coding having a specific code rate (e.g., 1/3), the code rate of the data to be transmitted is adjusted through a rate-matching procedure consisting of puncturing and repetition. When the turbo code is used as a channel code in the LTE/LTE-A system, a procedure of performing channel coding and rate-matching on each code block in the transport block processing procedure as illustrated in FIG. 1 is illustrated in FIG. 2.

Figure 2:
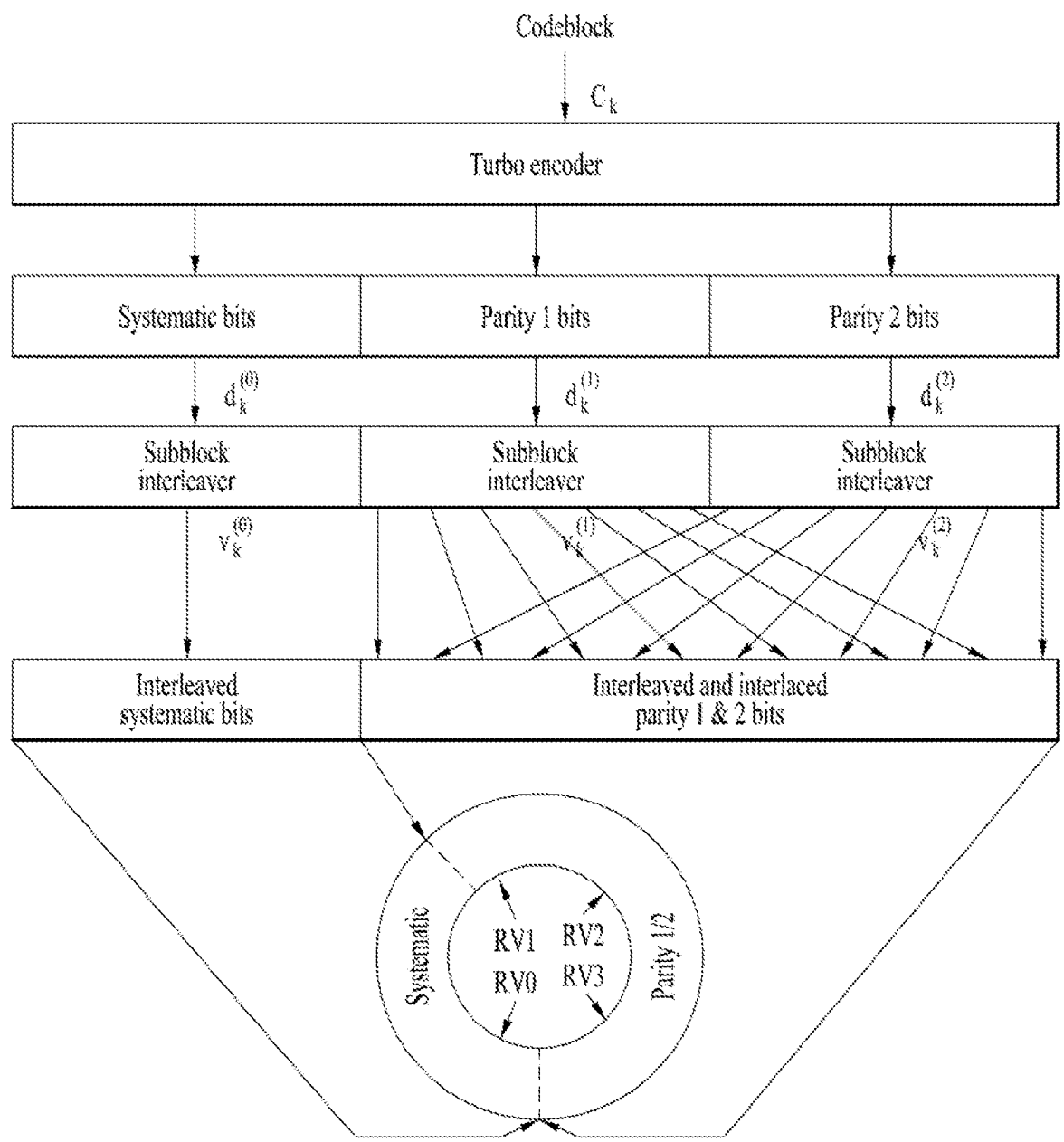
FIG. 2 is a block diagram illustrating rate matching performed by separating an encoded code block into a systematic part and a parity part.

FIG. 2 is a block diagram illustrating rate matching performed by separating an encoded code block into a systematic part and a parity part.

As illustrated in FIG. 2, the mother code rate of an LTE/LTE-A turbo encoder is 1/3. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 3:
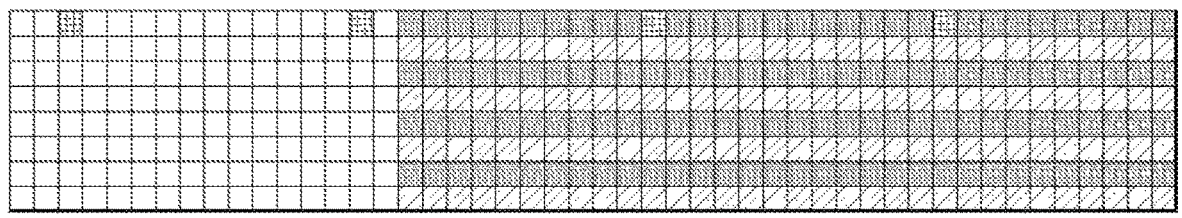
FIG. 3 illustrates an internal structure of a circular buffer.

FIG. 3 illustrates an internal structure of a circular buffer.

The circular buffer is the most important part of the rate matching module, making it possible to perform puncturing and repetition of a mother code. Referring to FIG. 2, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than 1/3), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 3, with the progressing number of retransmissions, the RV becomes higher and therefore fewer systematic bits and more parity bits are read out from the circular buffer for retransmission.

NR provides higher speeds and better coverage than current 4G. NR operates in a high frequency band and is required to offer speeds of up to 1 Gb/s for tens of connections or tens of Mb/s for tens of thousands of connections. To meet requirements of such an NR system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In NR, low calculation complexity, low latency, low cost, and higher flexibility are demanded for a coding scheme. Furthermore, reduced energy per bit and improved region efficiency are needed to support a higher data rate. Use examples for NR networks are enhanced mobile broadband (eMBB), massive Internet of things (IoT), and ultra-reliable and low latency communication (URLLC). eMBB covers Internet access with high data rates to enable rich media applications, cloud storage and applications, and augmented reality for entertainment. Massive IoT applications include dense sensor networks for smart homes/buildings, remote health monitoring, and logistics tracking. URLLC covers critical applications that demand ultra-high reliability and low latency, such as industrial automation, driverless vehicles, remote surgery, and smart grids.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

Polar codes are codes providing a new framework capable of solving problems of legacy channel codes and were invented by Arikan at Bilkent University (reference: E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009). Polar codes are the first capacity-achieving codes with low encoding and decoding complexities, which were proven mathematically. Polar codes outperform the turbo codes in large block lengths while no error flow is present. Hereinafter, channel coding using the polar codes is referred to as polar coding.

Polar codes are known as codes capable of achieving the capacity of a given binary discrete memoryless channel. This can be achieved only when a block size is sufficiently large. That is, polar codes are codes capable of achieving the capacity of a channel if the size N of the codes infinitely increases. Polar codes have low encoding and decoding complexity and may be successfully decoded. Polar codes are a sort of linear block error correction codes. Multiple recursive concatenations are basic building blocks for the polar codes and are bases for code construction. Physical conversion of channels in which physical channels are converted into virtual channels occurs and such conversion is based on a plurality of recursive concatenations. If multiple channels are multiplied and accumulated, most of the channels may become better or worse. The idea underlying polar codes is to use good channels. For example, data is sent through good channels at rate 1 and data is sent through bad channels at rate 0. That is, through channel polarization, channels enter a polarized state from a normal state.

Figure 4:
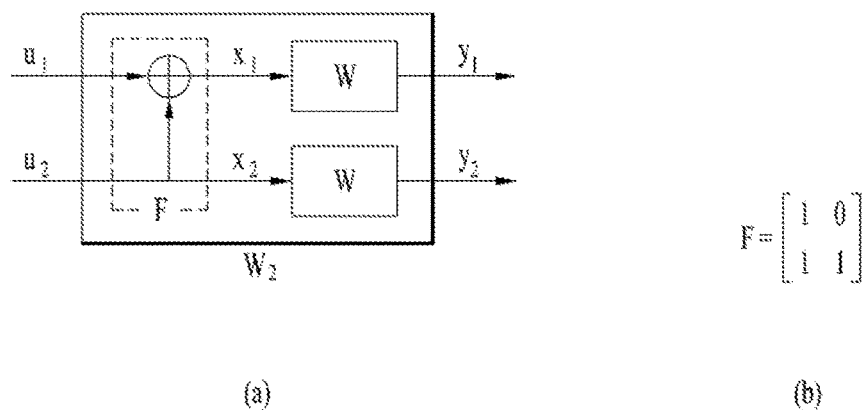
FIG. 4 is a block diagram for a polar code encoder.

FIG. 4 is a block diagram for a polar code encoder.

FIG. 4(a) illustrates a base module of a polar code, particularly, first level channel combining for polar coding. In FIG. 4(a), $W_2$ denotes an entire equivalent channel obtained by combining two binary-input discrete memoryless channels (B-DMCs), Ws. Herein, $u_1$ and $u_2$ are binary-input source bits and $y_1$ and $y_2$ are output coded bits. Channel combining is a procedure of concatenating the B-DMCs in parallel.

FIG. 4(b) illustrates a base matrix F for the base module. The binary-input source bits $u_1$ and $u_2$ input to the base matrix F and the output coded bits $x_1$ and $x_2$ of the base matrix F have the following relationship.

$$[u_1 \ u_2]\begin{bmatrix} 1 & 0 \\ 1 & 1 \end{bmatrix} = [x_1 \ x_2] \quad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} 1/2 W(y|x) \log \frac{w(y|x)}{1/2w(y|0) + 1/2w(y|1)} \quad \text{Equation 2}$$

It is possible to synthesize or create a second set of N binary input channels out of N independent copies of a given B-DMC W and the channels have the properties $\{W_N^{(i)}: 1 \leq i \leq N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \leq i \leq N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1−I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 5:
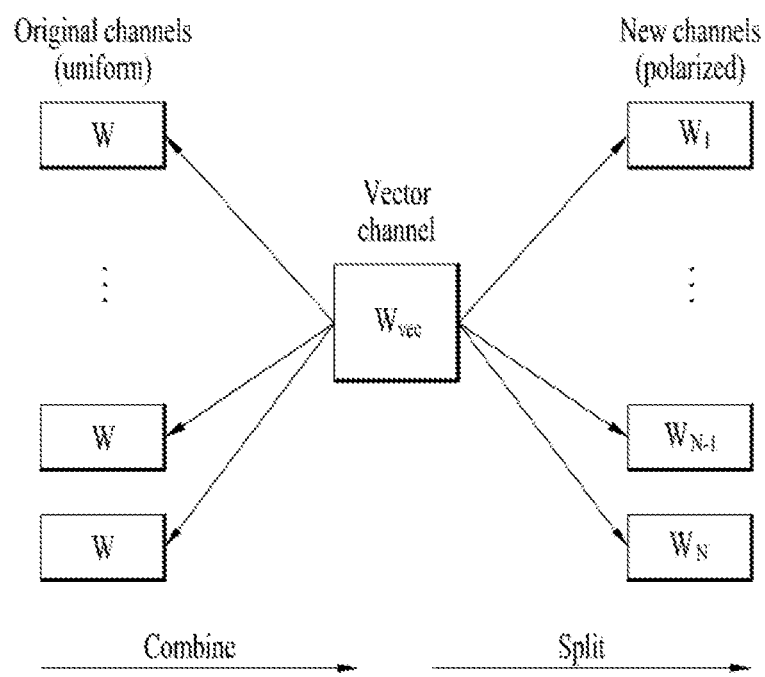
FIG. 5 illustrates the concept of channel combining and channel splitting for channel polarization.
Figure 5:
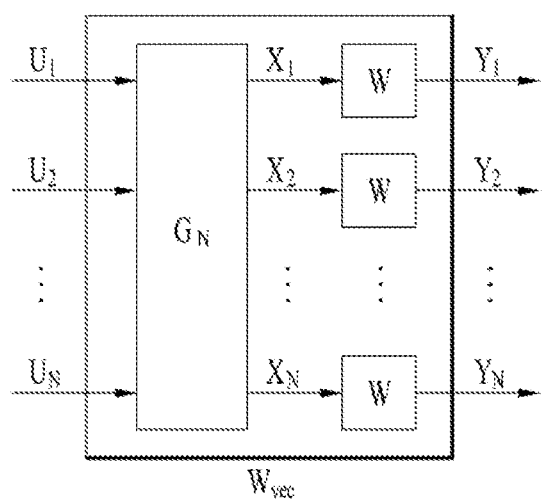

FIG. 5 illustrates the concept of channel combining and channel splitting for channel polarization. As illustrated in FIG. 5, when N copies of an original channel W are properly combined to create a vector channel $W_{vec}$ and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=0 cannot transport information, it is better to transport frozen bits, which are meaningless bits, therethrough.

Referring to FIG. 5, copies of a given B-DMC W are combined in a recursive manner to output a vector channel $W_{vec}$ given by $X_N \rightarrow Y_N$, where $N=2^n$ and n is an integer equal to or greater than 0. Recursion always begins at the 0th level and $W_1=W$. If n is 1 (n=1), this means the first level of recursion in which two independent copies of $W_1$ are combined. If the above two copies are combined, a channel $W_2$: $X_2 \rightarrow Y_2$ is obtained. A transitional probability of this new channel $W_2$ may be represented by the following equation.

$$W_2(y_1,y_2|u_1,u_2)=W(y_1|u_1 \oplus u_2)W(y_1|u_2) \quad \text{Equation 3}$$

If the channel $W_2$ is obtained, two copies of the channel $W_2$ are combined to obtain a single copy of a channel $W_4$. Such recursion may be represented by $W_4: X_4 \rightarrow Y_4$ having the following transitional probability.

$$W_4(y_1^4|u_1^4)=W_2(y_1^2|u_1 \oplus u_2, u_3 \oplus u_4)W_2(y_3^4|u_2,u_4) \quad \text{Equation 4}$$

In FIG. 5, $G_N$ is a size-N generator matrix. $G_2$ corresponds to the base matrix F illustrated in FIG. 4(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix}^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{Equation 5}$$

Herein, $\otimes$ denotes the Kronecker product, $A^{\otimes n}= A \otimes A^{\otimes(n-1)}$ for all $n \geq 1$, and $A^{\otimes 0}=1$.

The relationship between input $u_1^N$ to $G_N$ and output $x_1^N$ of $G_N$ of FIG. 5(b) may be represented as $x_1^N=u_1^N G_N$, where $x_1^N=\{x_1, \ldots, x_N\}$, $u_1^N=\{u_1, \ldots, u_N\}$ When N B-DMCs are combined, each B-DMC may be expressed in a recursive manner. That is, $G_N$ may be indicated by the following equation.

$$G_N=B_N F^{Wn} \quad \text{Equation 6}$$

Herein, $N=2^n$, $n \geq 1$, $F^{\otimes n}=F \otimes F^{\otimes(n-1)}$, and $F^{\otimes 0}=1$. $B_N$ is a permutation matrix known as a bit-reversal operation and $B_N=R_N(I_2 \otimes B_{N/2})$ and may be recursively computed. $I_2$ is a 2-dimensional identity matrix and this recursion is initialized to $B_2=I_2$. $R_N$ is a bit-reversal interleaver and is used to map an input $s_1^N=\{s_1, \ldots, s_N\}$ to an output $x_1^N = \{s_1, s_3, \ldots, s_{N-1}, s_2, \ldots, s_N\}$. The bit-reversal interleaver may not be included in a transmitting side. The relationship of Equation is illustrated in FIG. 6.

Figure 6:
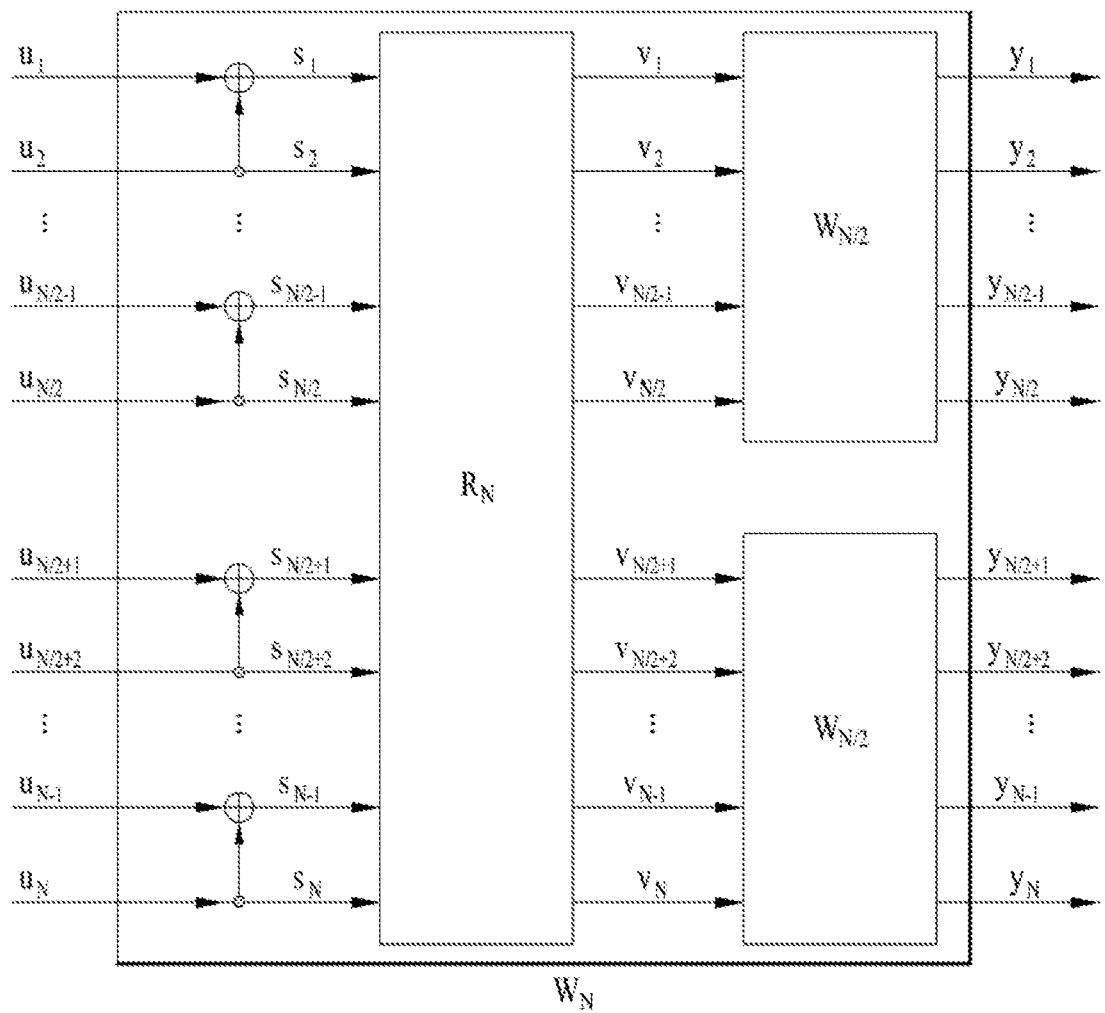
FIG. 6 illustrates N-th level channel combining for a polar code.

FIG. 6 illustrates N-th level channel combining for a polar code.

A process of defining an equivalent channel for specific input after combining N B-DMCs Ws is called channel splitting. Channel splitting may be represented as a channel transition probability indicated by the following equation.

$$W_N^i(y_1^N, u_1^{i-1} | u_i) = \sum_{u_{i+1}^N} \frac{1}{2^{N-1}} W_N(y_1^N | u_1^N)$$

Equation 7

Channel polarization has the following characteristics:

Conservation: $C(W^-)+C(W^+)=2C(W)$,

Extremization: $C(W^-) \leq C(W) \leq C(W^+)$.

When channel combining and channel splitting are performed, the following theorem may be obtained.

Theorem: For any B-DMC W, channels $\{W_N^{(i)}\}$ are polarized in the following sense. For any fixed $\delta \in \{0, 1\}$, as N goes to infinity through powers of 2, the fraction of indexes $i \in \{1, \ldots, N\}$ for channel capacity $I(W_N^{(i)}) \in (1-\delta, 1]$ goes to $I(W)$ and the faction of i for channel capacity $I(W_N^{(i)}) \in [0, \delta)$ goes to $1-I(W)$. Hence, if $N \to \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or I(W).

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present disclosure, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

A decoding scheme of the polar codes is a successive cancellation (SC) decoding scheme. The SC decoding scheme obtains a channel transition probability and then calculates a likelihood ratio (LLR) of input bits using the channel transition probability. In this case, the channel transition probability may be calculated in a recursive form if channel combining and channel splitting procedures use characteristics of the recursive form. Therefore, a final LLR value may also be calculated in the recursive form. First, a channel transition probability $W_N^{(i)}(y_1^N, u_1^{i-1} | u_1)$ of an input bit $u_i$ may be obtained as follows. $u_1^i$ may be split into odd indexes and even indexes as expressed as $u_{1,o}^i, u_{1,e}^i$, respectively. The channel transition probability may be indicated by the following equations.

$$W_{2N}^{(2i-1)}(y_1^{2N}, u_1^{2i-1} | u_{2i-1}) = \sum_{u_{2i+1}^{2N}} \frac{1}{2^{2N-1}} W_{2N}(y_1^{2N} | u_1^{2N}) =$$

$$\sum_{u_{2i,o}^{2N}, u_{2i,e}^{2N}} \frac{1}{2^{2N-1}} W_N(y_1^N | u_{1,o}^{2N} \oplus u_{i,e}^{2N}) W_N(y_{N+1}^{2N} | u_{1,e}^{2N}) =$$

$$\sum_{u_{2i}} \frac{1}{2} \sum_{u_{2i+1,e}^{2N}} \frac{1}{2^{2N-1}} W_N(y_{N+1}^{2N} | u_{1,e}^{2N}) \cdot$$

$$\sum_{u_{2i+1,o}^{2N}} \frac{1}{2^{2N-1}} W_N(y_1^N | u_{1,o}^{2N} \oplus u_{i,e}^{2N}) =$$

$$\sum_{u_{2i}} \frac{1}{2} W_N^{(i)}(y_1^N, u_{1,o}^{2i-2} \oplus u_{i,e}^{2i-2} | u_{2i-1} \oplus u_{2i}) \cdot$$

$$W_N^{(i)}(y_{N+1}^{2N}, u_{1,e}^{2i-2} | u_{2i}) \text{ where}$$

$$W_N^{(i)}(y_1^N, u_1^{i-1} | u_i) = \sum_{u_{i+1}^N} \frac{1}{2^{N-1}} W_N(y_1^N | u_1^N).$$

Equation 8

$$W_{2N}^{(2i)}(y_1^{2N}, u_1^{2i-1} | u_{2i}) = \sum_{u_{2i+1}^{2N}} \frac{1}{2^{2N-1}} W_{2N}(y_1^{2N} | u_1^{2N}) =$$

$$\sum_{u_{2i+1,o}^{2N}, u_{2i+1,e}^{2N}} \frac{1}{2^{2N-1}} W_N(y_1^N | u_{1,o}^{2N} \oplus u_{i,e}^{2N}) W_N(y_{N+1}^{2N} | u_{1,e}^{2N}) =$$

$$\frac{1}{2} \sum_{u_{2i+1,e}^{2N}} \frac{1}{2^{N-1}} W_N(y_{N+11}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{i,e}^{2N}) =$$

$$\frac{1}{2} W_N^{(i)}(y_1^N, u_{1,o}^{2i-2} \oplus u_{i,e}^{2i-2} | u_{2i-1} \oplus u_{2i}) \cdot$$

$$W_N^{(i)}(y_{N+1}^{2N}, u_{1,e}^{2i-2} | u_{2i})$$

Equation 9

A polar decoder retrieves information and generates an estimate $\hat{u}_1^N$ of $u_1^N$ using values (e.g., reception bits, frozen bits, etc.) known for the polar codes. The LLR is defined as follows.

$$L_N^{(i)}(y_1^N, u_1^{i-1}) = \frac{W_N^{(i)}(y_1^N, u_1^{i-1} | u_i = 0)}{W_N^{(i)}(y_1^N, u_1^{i-1} | u_i = 1)}$$

Equation 10

The LLR may be recursively calculated as follows.

$$L_N^{(2i-1)}(y_1^N, \hat{u}_1^{2i-2}) = \frac{L_{N/2}^{(i)}(y_1^{N/2}, \hat{u}_{1,o}^{2i-2} \oplus \hat{u}_{1,e}^{2i-2}) \cdot L_{N/2}^{(i)}(y_{N/2+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{N/2+1}^N, \hat{u}_{1,e}^{2i-2})}$$

Equation 11

-continued $$L_N^{(2i)}(y_1^N, \hat{u}_1^{2i-1}) =$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{N/2+1}^N, \hat{u}_{1,e}^{2i-2})$$

Recursive calculation of LLRs is traced back to a code length of 1 with an LLR $L^{(1)}_1(y_i) = W(y_i|0)/W(y_i|1)$. $L^{(1)}_1(y_i)$ is soft information observed from a channel.

The complexity of a polar encoder and an SC decoder varies with the length N of polar codes and is known as having O(N log N). Assuming that K input bits are used for a length-N polar code, a coding rate becomes N/K. If a generator matrix of a polar encoder of a data payload size N is $G_N$, an encoded bit may be represented as $x_1^N = u_1^N G_N$. It is assumed that K bits out of $u_1^N$ correspond to payload bits, a row index of $G_N$ corresponding to the payload bits is i, and a row index of $G_N$ corresponding to (N−K) bits is F. A minimum distance of the polar codes may be given as $d_{min}(C) = \min_{i \in I} 2^{wt(i)}$, where wt(i) is the number of is within binary extension of i and i=0, 1, ..., N−1.

SC list (SCL) decoding is an extension of a basic SC decoder. In this type of decoder, L decoding paths are simultaneously considered in each decoding stage. Herein, L is an integer. In other words, in the case of the polar codes, a list-L decoding algorithm is an algorithm for simultaneously tracking L paths in a decoding process.

Figure 7:
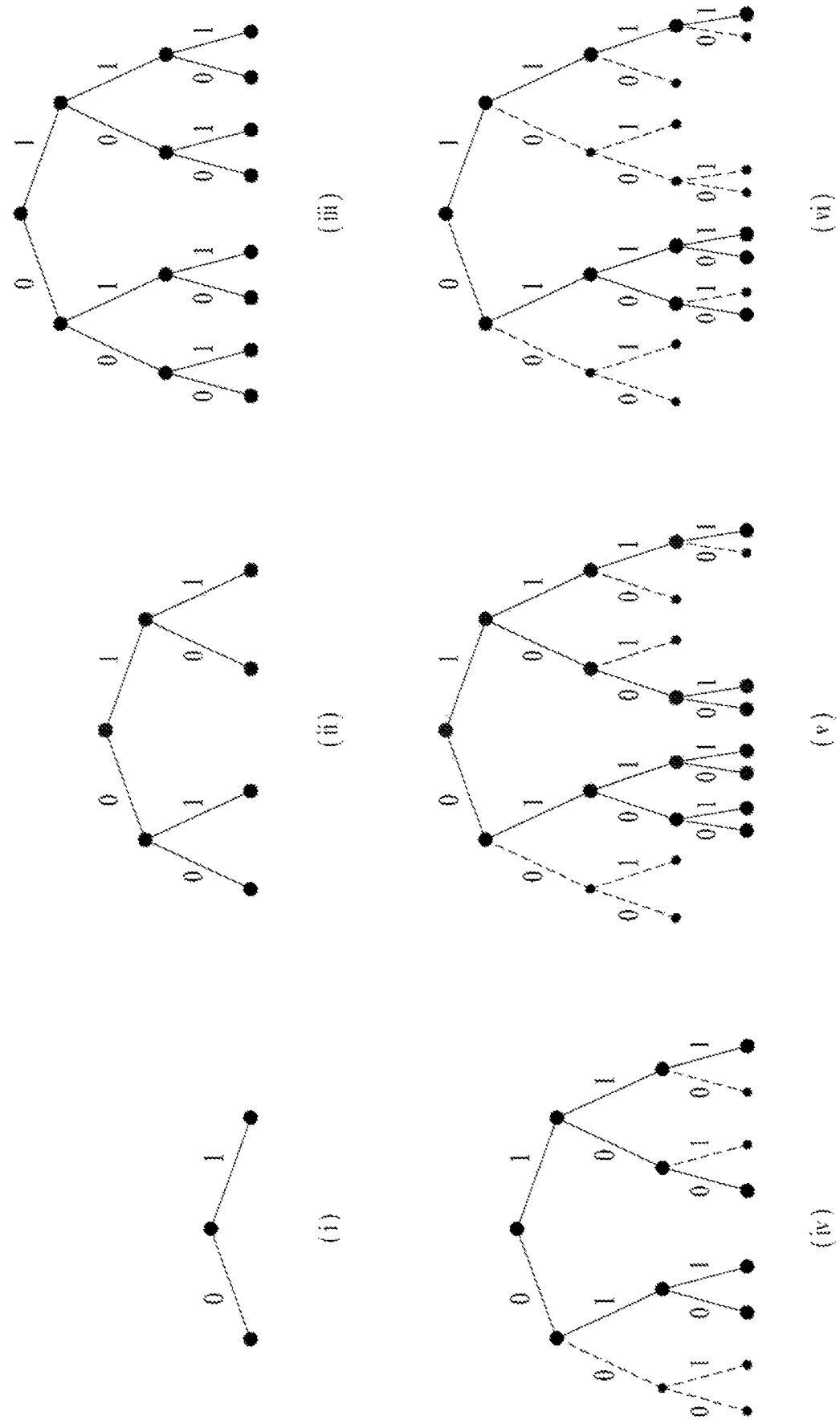
FIG. 7 illustrates an evolution of decoding paths in a list-L decoding process.

FIG. 7 illustrates an evolution of decoding paths in a list-L decoding process. For convenience of description, it is assumed that the number of bits that should be determined is n and all bits are not frozen. If a list size L is 4, each level includes at most 4 nodes with paths that continue downward. Discontinued paths are expressed by dotted lines in FIG. 7. A process in which decoding paths evolve in list-L decoding will now be described with reference to FIG. 7. i) If list-L decoding is started, the first unfrozen bit may be either 0 or 1. ii) list-L decoding continues. The second unfrozen bits may be either 0 or 1. Since the number of paths is not greater than L=4, pruning is not needed yet. iii) Consideration of all options for the first bit (i.e., a bit of the first level), the second bit (i.e. a bit of the second level), and the third bit (i.e., a bit of the third level) results in 8 decoding paths which are excessive because L=4. iv) the 8 decoding paths are pruned to L (=4) promising paths. v) 4 active paths continue by considering two options of the fourth unfrozen bit. In this case, the number of paths is doubled, i.e., 8 paths which are excessive because L=4. vi) The 8 paths are pruned back to L (=4) best paths. In the example of FIG. 7, 4 candidate codewords 0100, 0110, 0111, and 1111 are obtained and one of the codewords is determined to be a codeword most similar to an original codeword. In a similar manner to a normal decoding process, for example, in a pruning process or a process of determining a final codeword, a path in which the sum of LLR absolute values is largest may be selected as a survival path. If a CRC is present, the survival path may be selected through the CRC.

Meanwhile, CRC-aided SCL decoding is SCL decoding using CRC and improves the performance of polar codes. CRC is the most widely used technique in error detection and error correction in the field of information theory and coding. For example, if an input block of an error correction encoder has K bits and the length of information bits is k, and the length of CRC sequences is m bits, then K=k+m. CRC bits are a part of source bits for an error correction code. If the size of channel codes used for encoding is N, a code rate R is defined as R=K/N. CRC aided SCL decoding serves to detect an errorless path while a receiving device confirms a CRC code with respect to each path. An SCL decoder outputs candidate sequences to a CRC detector. The CRC detector feeds back a check result in order to aid in determining a codeword.

Although complicated as compared with an SC algorithm, SCL decoding or CRC aided SCL decoding has an advantage of excellent decoding performance. For more details of a list-X decoding algorithm of the polar codes, refer to 'I. Tal and A. Vardy, "List decoding of polar codes," in Proc. IEEE Int. Symp. Inf. Theory, pp. 1-5, July 2011'.

In the polar codes, code design is independent of a channel and hence is not versatile for mobile fading channels. In addition, the polar codes have a disadvantage of limited application because the codes have recently been introduced and have not grown yet. That is, polar coding proposed up to now has many parts that have not been defined to apply to a wireless communication system. Therefore, the present disclosure proposes a polar coding method suitable for the wireless communication system.

Figure 8:
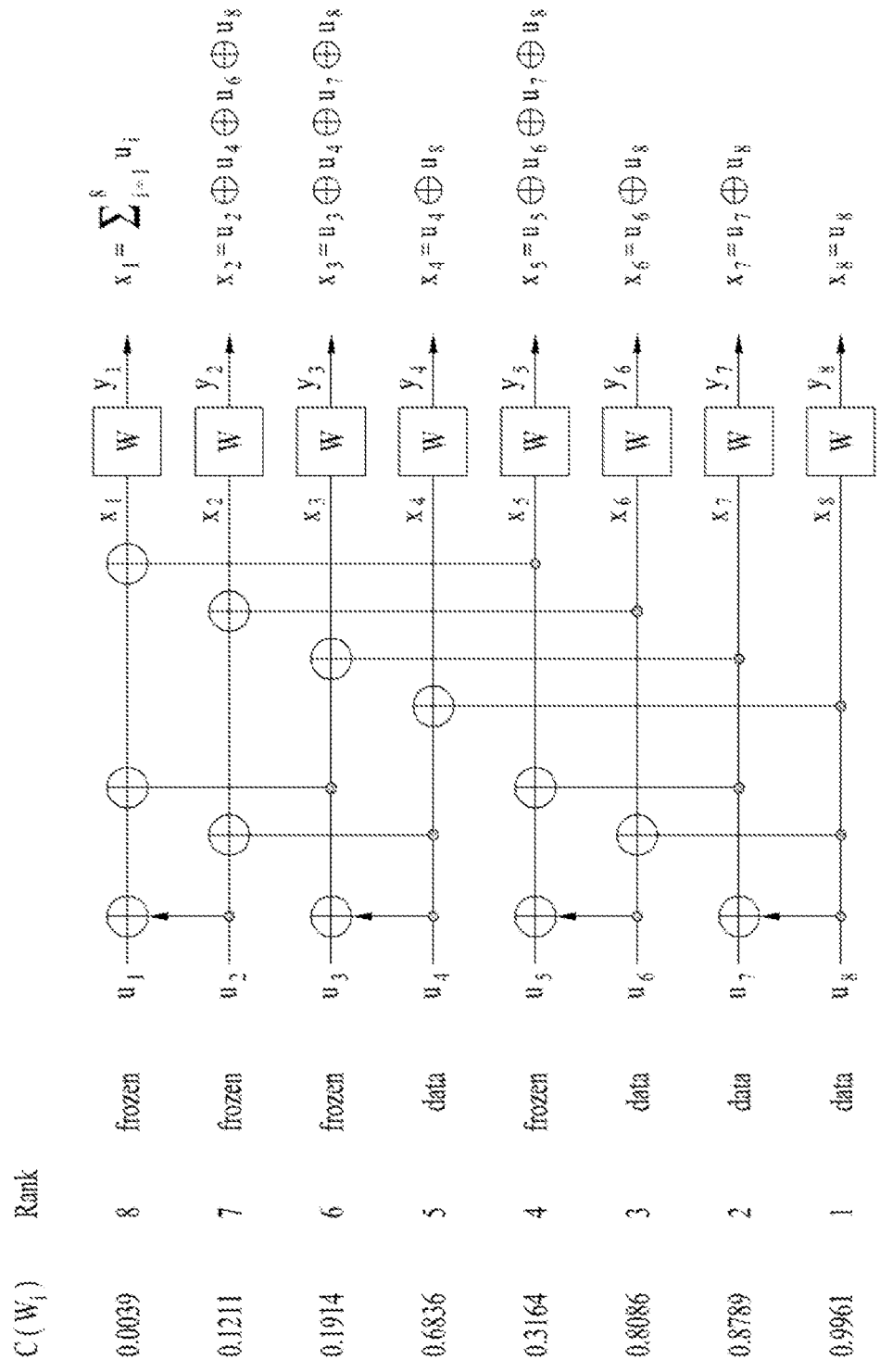
FIG. 8 illustrates the concept of selecting position(s) to which information bit(s) are to be allocated in polar codes.

FIG. 8 illustrates the concept of selecting position(s) to which information bit(s) are to be allocated in polar codes.

In FIG. 8, it is assumed that the size N of mother codes is 8, i.e., the size N of polar codes is 8, and a code rate is 1/2.

In FIG. 8, $C(W_i)$ denotes the capacity of a channel $W_i$ and corresponds to the reliability of channels that input bits of a polar code experience. When channel capacities corresponding to input bit positions of the polar code are as illustrated in FIG. 8, reliabilities of the input bit positions are ranked as illustrated in FIG. 8. To transmit data at a code rate of 1/2, a transmitting device allocates 4 bits constituting the data to 4 input bit positions having high channel capacities among 8 input bit positions (i.e., input bit positions denoted as $U_4$, $U_6$, $U_7$, and $U_4$ among input bit positions $U_1$ to $U_8$ of FIG. 8) and freezes the other input bit positions. A generator matrix $G_8$ corresponding to the polar code of FIG. 8 is as follows. The generator matrix $G_8$ may be acquired based on Equation 6.

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 12}$$

The input bit positions denoted as $U_1$ to $U_8$ of FIG. 8 correspond one by one to rows from the lowest row to the highest row of $G_8$. Referring to FIG. 8, it may be appreciated that the input bit corresponding to $U_8$ affects all output coded bits. On the other hand, it may be appreciated that the input bit corresponding to $U_1$ affects only $Y_1$ among the output coded bits. Referring to Equation 12, when binary-input source bits $U_1$ to $U_8$ are multiplied by $G_8$, a row in which the input bits appear at all output bits is the lowest row [1, 1, 1, 1, 1, 1, 1, 1] in which all elements are 1, among rows of $G_8$. Meanwhile, a row in which the binary-input source bits appears at only one output bit is a row in which one element is 1 among the rows of $G_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, $U_1$ to $U_8$ correspond one by one to the rows of $G_8$ and bit indexes for distinguishing between input positions of $U_1$ to $U_8$, i.e., bit indexes for distinguishing between the input positions, may be assigned to the rows of $G_8$.

Hereinafter, for Polar codes, it may be assumed that bit indexes from 0 to N−1 are sequentially allocated to rows of $G_N$ starting from the highest row having the smallest row weight with respect to N input bits. For example, referring to FIG. 8, a bit index 0 is allocated to the input position of $U_1$, i.e., the first row of $G_8$ and a bit index 7 is allocated to the input position of $U_8$, i.e., the last row of $G_8$. However, since the bit indexes are used to indicate input positions of the polar code, a scheme different from the above allocation scheme may be used. For example, bit indexes from 0 to N−1 may be allocated staring from the lowest row having the largest row weight.

In the case of output bit indexes, as illustrated in FIG. 8 and Equation 12, it may be assumed that bit indexes from 0 to N−1 or bit indexes from 1 to N are assigned to columns from the first column having the largest column weight to the last column having the smallest column weight among columns of $G_N$.

In Polar codes, setting of information bits and frozen bits is one of the most important elements in the configuration and performance of the polar code. That is, determination of ranks of input bit positions may be an important element in the performance and configuration of the polar code. For Polar codes, bit indexes may distinguish input or output positions of the polar code. In the present disclosure, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit index sequence which is identical to or corresponds to an input bit sequence used by the transmitting device and using a corresponding polar code. In the following description, it may be assumed that an input bit sequence is predetermined so that information bit(s) may be allocated to input bit position(s) having high reliabilities.

Figure 9:
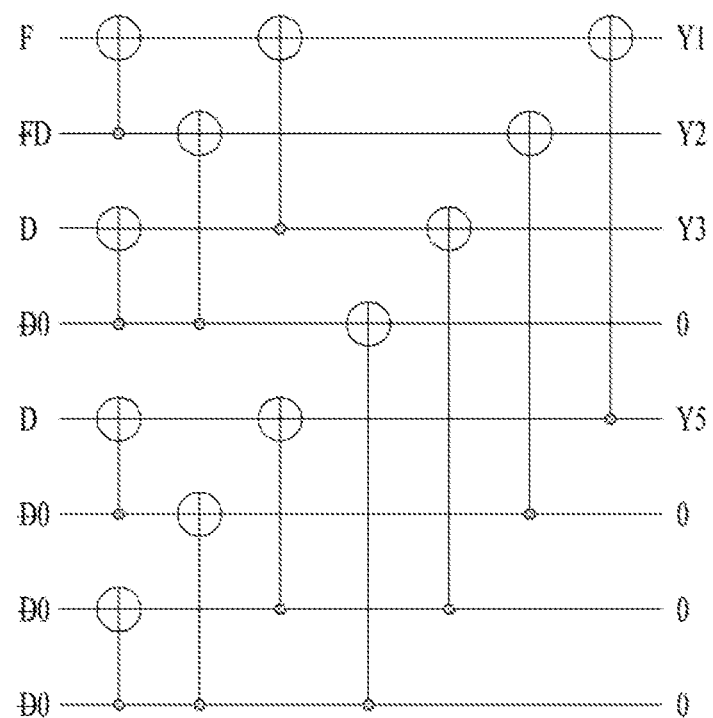
FIG. 9 illustrates puncturing and information bit allocation according to the present disclosure.

FIG. 9 illustrates puncturing and information bit allocation for polar codes. In FIG. 9, F denotes a frozen bit, D denotes an information bit, and 0 denotes a skipping bit.

Among coded bits, the case in which an information bit is changed to a frozen bit may occur according to an index or position of a punctured bit. For example, if output coded bits for a mother code of N=8 should be punctured in order of Y8, Y7, Y6, Y4, Y5, Y3, Y2, and Y1 and a target code rate is 1/2, then Y8, Y7, Y6, and Y4 are punctured, U8, U7, U6, and U4 connected only to Y8, Y7, Y6, and Y4 are frozen to 0, and these input bits are not transmitted, as illustrated in FIG. 9. An input bit changed to a frozen bit by puncturing of a coded bit is referred to as a skipping bit or a shortening bit and a corresponding input position is referred to as a skipping position or a shortening position. Shortening is a rate matching method of inserting a known bit into an input bit position connected to a position of an output bit desired to be transmitted while maintaining the size of input information (i.e., the size of information blocks). Shortening is possible starting from input corresponding to a column in which a column weight is 1 in a generator matrix $G_N$ and next shortening may be performed with respect to input corresponding to a column in which a column weight is 1 in a remaining matrix from which a column and row in which a column weight is 1 are removed. To prevent all information bits from being punctured, an information bit that should have been allocated to an information bit position may be reallocated in order of a high reliability within a set of frozen bit positions.

In the case of the polar code, decoding may be generally performed in the following order.
1. Bit(s) having low reliabilities are recovered first. Although reliability differs according to the structure of a decoder, since an input index in an encoder (hereinafter, an encoder input index) having a low value usually has a low reliability, decoding is generally performed staring from a low encoder input index.
2. When there is a known bit for a recovered bit, the known bit is used together with the recovered bit or the process of 1 is omitted and a known bit for a specific input bit position is immediately used, thereby recovering an information bit, which is an unknown bit. The information bit may be a source information bit (e.g., a bit of a transport block) or a CRC bit.

A block of bits obtained after information bits are subjected to channel coding, rate matching, and code block concatenation is modulated by a modulation mapper to be a block of complexed-modulation symbols. The modulation mapper receives binary digits as input and produces the complexed-modulation symbols as output. Binary phase shift keying (BPSK), quadrature phase shift keying (QPSK), 16 quadrature amplitude modulation (16QAM), 64QAM, 256QAM, and the like may be used as a modulation scheme to be used in an NR system.

Typically, during design of polar codes, it is assumed that each bit of a coded block passes through an identically distributed underlying binary-input discrete memoryless channel (BI-DMC). Although this assumption is true for an additive white Gaussian noise (AWGN) channel, the assumption is not always valid even when modulation schemes of a modulation order higher than QPSK are employed. This is because modulation schemes of a high order, such as 16QAM, 64QAM, and 256QAM, may well protect some bits relative to other bits. Accordingly, modulation schemes (e.g., BPSK and QPSK) in which the complexed-modulation symbols have equal signal strength do not cause performance deterioration of the polar codes. However, in the case of modulation schemes such as 16QAM, 64QAM, and 256QAM that may be unequal in signal strength according to constellations of the complexed-modulation symbols, performance of the polar codes may be degraded. The present disclosure proposes a method of preventing performance deterioration of the polar codes that may be generated in a modulation scheme having a modulation order higher than 4QAM or QPSK. Particularly, the present disclosure proposes a block-like interleaver to prevent performance deterioration of the polar codes. Typically, a block interleaver is configured such that information is written in a memory along rows at the start of each column and information is read out from the memory along rows at the start of each row, or information is written in the memory along columns at the start of each row and information is read out from the memory along rows at the start of each column. Since only using such a typical block interleaver may not prevent performance degradation of the polar codes, the present disclosure proposes a new block interleaver.

A polar code is degraded in coding performance due to characteristics of the structure thereof when a modulation order is a multiple of 4. This problem arises because some of coded bits are positioned at only a most information bit (MIB) or the MIB and a least information bit (LIB), and some of the other coded bits are positioned only at the LIB. An output of a higher row stage of the polar code is typically affected multiple inputs and thus has high interference therein, whereas an output of a lower row stage is affected by few inputs relative to the output of the higher row stage and thus has low interference. For example, referring to FIG. 8, $x_1$ is affected by $u_1$ to $u_8$, whereas $x_8$ is affected only by $u_8$. Therefore, it may be said that $x_1$ has higher interference than $x_8$. To well perform successive cancellation in a decoding process, a bit having high interference and a bit having low interference need to be mixed. Therefore, if output bits of specific positions (e.g., positions corresponding to multiples of 4) in an output sequence of the polar code are always positioned at LIBs in complexed-modulation symbols, since only output bit(s) having high interference are positioned at MIBs, decoding performance is deteriorated. For example, when output bits of the polar code having a mother code size of N=32 are sequentially indexed from 0 to 31, in the case of 16QAM, each of blocks of 4 output bits (i.e., each of a block of output bits 0 to 3, a block of output bits 4 to 7, . . . , a block of output bits 28~31) is modulated to one complexed-modulation symbol. If the first bit in a block of output bits corresponds to a high row relative to the second to fourth bits and the fourth bit corresponds to a low row of the polar code relative to the first to third bits, the first bit in each block of output bits may be positioned at an MIB of the complexed-modulation symbol and the fourth bit may be positioned at an LIB of the complexed-modulation symbol. That is, importance levels between bits may differ even in one complexed-modulation symbol. For example, in the case of 256QAM, 8 bits of one complexed-modulation symbol may have a total of 4 different importance levels by grouping the 8 bits in units of 2 bits. Likewise, even for 64QAM and 256QAM having different importance levels between bit positions in the complexed-modulation symbol, if specific bits are included in the same importance level (e.g., MIB), the same problem as in 16QAM may occur.

The present disclosure proposes a block-like interleaver and a reading operation in the block-like interleaver in order to prevent deterioration of modulation performance caused by structural characteristics of polar codes. Hereinbelow, the present disclosure will be described focusing on 16QAM, a modulation order of which is 4, by way of example. However, the present disclosure may be equally applied to 64QAM and 256QAM of other modulation orders in which complexed-modulation symbols corresponding to modulation outputs have unequal signal strength.

16QAM modulates 4 coded bits grouped into a block to one complexed-modulation symbol. That is, according to 16QAM, a block of 4 bits is mapped to one complexed-modulation symbol among 16 complexed-modulation symbols. The present disclosure proposes that output bits of positions corresponding to multiples of Q in an output sequence of a polar code with respect to a modulation order of Q have a difference of 1 between starting positions of Q grouped bits so that the output bits may have different importance levels within symbols. For example, according to the present disclosure, in the case of 16QAM, upon generating a complexed-modulation symbol (hereinafter, a symbol), a starting position of 4 grouped bits for modulation may be shifted by 1 so that output bits of specific positions (e.g., positions corresponding to multiples of 4) in an output sequence of a polar code may have different importance levels in different symbols. For example, in the prior art method, when 4 grouped bits are modulated, 3 bits of a block j of 4 bits that should be mapped to one symbol are grouped with the last one bit of a block j−1 of 4 bits, and the grouped bits are mapped to one symbol. The last one bit of the block j of the 4 bits are grouped with front 3 bits of a block j+1 of 4 bits and the grouped bits are mapped to another symbol. For reference, the present disclosure will be described by taking an example in which reading start positions between columns have a difference of 1 (i.e., case in which a shift value is 1). However, an integer value which is not an integer multiple of the number of columns of an interleaver may be used as the shift value.

Figure 10:
FIG. 10 illustrates a modulation method to aid in understanding the present disclosure.
Figure 10:

FIG. 10 illustrates a modulation method to aid in understanding the present disclosure. Particularly, FIG. 10(a) illustrates an order in which coded bits are written in a memory of an interleaver. FIG. 10(b) illustrates the case in which starting positions at which data stored in memory(s) of the interleaver is read out in each row are equal. FIG. 10(c) illustrates a proposal of the present disclosure in which starting positions at which data stored in memory(s) of the interleaver is read out in each row are different. To show that a reading start position is shifted by 1 according to a row, FIG. 10 illustrates that separate memories corresponding to a modulation order are used. However, in actuality, the present disclosure may be applied to one memory. An example of the present disclosure is described in which coded bits are sequentially written in a memory of an interleaver in the direction of rear bits from the foremost bit. However, the coded bits may be sequentially written in the memory of the interleaver in the direction of front bits from the rearmost bit.

Referring to FIG. 10, for example, when the length of coded bits is 32, 4 memories and 8 rows in each memory are used for modulation. This may actually be understood as the case in which 4 columns and 8 rows are used to modulate the length-32 coded bits in one memory.

Numbers in FIG. 10(a) denote orders in which coded bits are written in memory(s) and numbers in FIG. 10(b) and FIG. 10(c) denote orders in which data stored in the memory(s) are read out. In FIG. 10(a), for example, the length-32 coded bits are sequentially written in the memories up to a position denoted by number '31' starting from a position denoted by number '0'. Numbers in FIG. 10(a) may indicate bit positions in a sequence of the length-32 coded bits. In FIGS. 10(b) and 10(c), for example, a bit in a position denoted by number '0' among the length-32 coded bits stored in the memory is a bit which is read out earliest and a bit in a position denoted by number '31' is a bit which is read out latest.

In the present disclosure, a memory reading order does not indicate a position of the memory in which coded bits are stored and indicates an order read out from the memory in which the coded bits are stored. For example, numbers of FIG. 10(a) which are output in the memory reading order according to FIG. 10(b) is 0, 8, 16, 24, 1, 9, 17, 25, . . . , 7, 15, 23, 31. On the other hand, numbers of FIG. 10(a) which are output in the memory reading order according to FIG. 10(c) is 0, 8, 16, 24, 9, 17, 25, 1, . . . , 31, 7, 15, 23.

Although FIG. 10(c) illustrates a memory reading start position which is (cyclically) shifted by 1 as a row varies, the memory reading start position may be (cyclically) shifted by 1 to the left as a row varies. In this case, the memory reading start position is shifted in a direction opposite to the direction shown in FIG. 10(c).

However, the method explained in FIG. 10(c) may be problematic in that some coded bits belong only to an LIB because 4 memories or 4 columns in a memory are used. To solve such an issue, the present disclosure may configure memories for modulation, i.e., memories of an interleaver as memories of an odd number (i.e., the number of columns of a memory is an odd number). The present disclosure proposes that a memory for a modulation order Mode be configured as, for example, "$Mod_n+1$" columns (or "$Mod_n-1$" columns).

Figure 11:
FIG. 11 illustrates a modified example of a modulation method to aid in understanding the present disclosure.

FIG. 11 illustrates a modified example of a modulation method to aid in understanding the present disclosure. Particularly, FIG. 11(a) illustrates an order in which coded bits are written in memory(s) when 5 memories are present (i.e., 5 memory columns are used for modulation). In FIG. 11(a), a coded bit is not stored in "X". Padding bits may be inserted into remaining positions at which 32 coded bits are not used among positions in the memories.

FIG. 11(b) illustrates an order in which data stored in the memory(s) is read out when a reading start position is shifted by 1 in rows. In FIG. 11(b), "X" may be disregarded and the next order may be used. Referring to FIG. 11(b), when 32 coded bits are stored as illustrated in FIG. 11(a), coded bits of 0, 7, 14, 21, 28, 8, 15, 22, 29, 1, 16, 23, 30, 2, 9, 24, 31, 3, 10, 17, 4, 11, 18, 25, 5, 12, 19, 26, 13, 20, 27, 6 are output from the memories (i.e., interleaver).

This method may also be used for modulation orders other than a modulation order of 4. A memory for modulation, i.e., the number of columns of the memory used for the interleaver, may be 'modulation order±odd number' so that the method may also be applied to a modulation order of 8.

Figure 12:
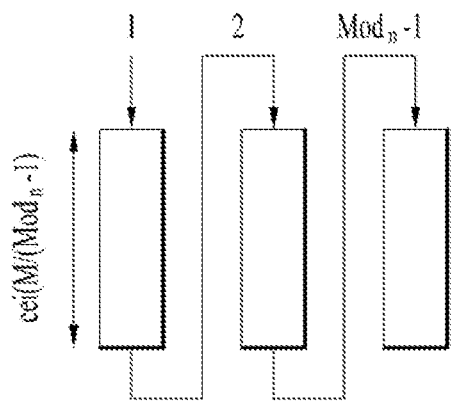
FIG. 12 illustrates a generalized modulation method according to a proposal of the present disclosure.
Figure 12:
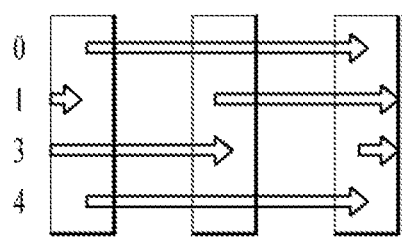
Figure 12:
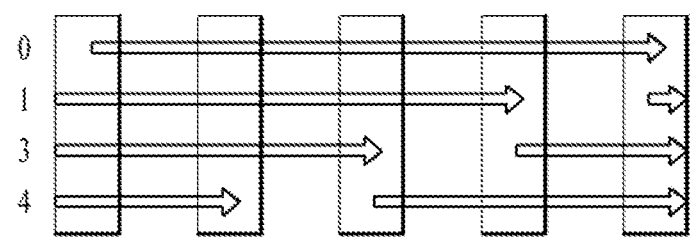

FIG. 12 illustrates a generalized modulation method according to a proposal of the present disclosure. Particularly, FIG. 12(a) illustrates a writing operation according to a proposal of the present disclosure. FIG. 12(b) and FIG. 12(c) illustrate reading operations according to a proposal of the present disclosure.

Referring to FIG. 12(a), the number of columns of a memory for modulation, i.e., the number of columns of an interleaver, in the present disclosure, is 'modulation order $Mod_n$±odd number' and the length of a row is ceil{M/(column size)}. Herein, M denotes the length of coded bits (i.e., the number of coded bits). The column size means the number of columns.

Typically, in a reading operation of the interleaver for modulation, bits for one constellation symbol are sequentially read out from the memory row-wise and input to a modulation block (i.e., a modulation mapper). A reading operation for one row is continuously performed up to the end of the row and a "NULL" bit (i.e., a bit of a position of a memory in which a coded bit is not stored) is skipped. If the reading operation for one row is performed up to the end of the row, a reading operation for the next row is performed. The present disclosure proposes that a reading operation be started at different reading points according to rows. For convenience of implementation, a cyclic shift scheme may be used. For example, FIG. 12(b) and FIG. 12(c) illustrate a reading process having a right cyclic shift value of 1 and a reading process having a left cyclic shift value of 1, respectively. FIG. 12(b) illustrates when a memory for a modulation order of 4, i.e., an interleaver, is configured by 3 columns and FIG. 12(c) illustrates when a memory for a modulation order of 4, i.e., an interleaver, is configured by 5 columns. However, the right cyclic shift illustrated in FIG. 12(b) may be applied when the number of columns for modulation is 'modulation order $Mod_n$+odd number' as well as when the number of columns for modulation is 'modulation order $Mod_n$-odd number'. Likewise, the left cyclic shift illustrated in FIG. 12(b) may be applied when the number of columns for modulation is 'modulation order $Mod_n$-odd number' as well as when the number of columns for modulation is 'modulation order $Mod_n$+odd number'.

The interleaver according to a proposal of the present disclosure may have the best performance without increasing complexity of implementation by changing a cyclic shift value, a cyclic shift direction, and/or the number of columns. The interleaver according to the proposal of the present disclosure may be immediately applied according to parameters of polar codes by fixing a writing operation (i.e., the writing operation is sequentially performed without applying a shift scheme used in a reading operation if the size of a column and the size of a row are determined) and changing a reading operation.

Figure 13:
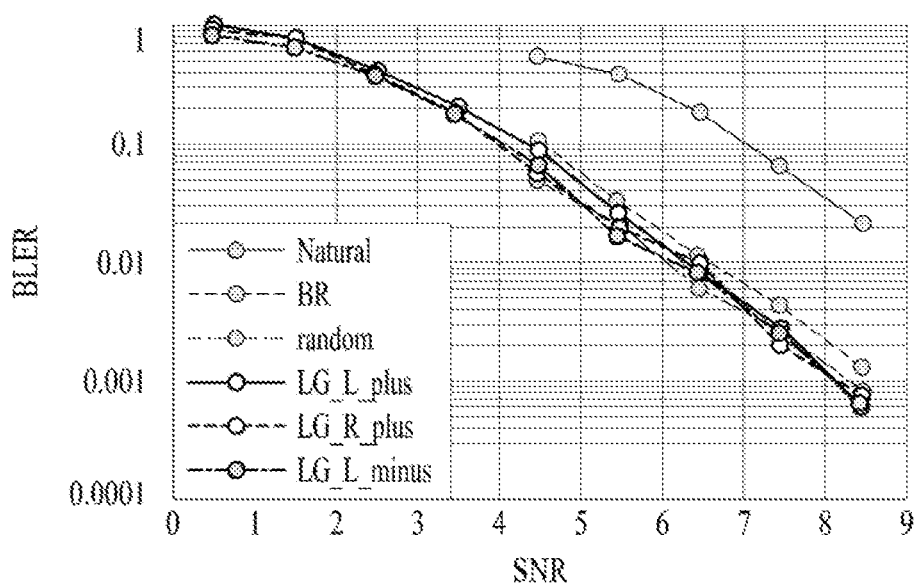
FIG. 13 illustrates performance when an interleaver according to the present disclosure is used for modulation.

FIG. 13 illustrates performance when an interleaver according to the present disclosure is used for modulation. FIG. 13 shows a simulation performed in an environment of mother code size of N=512, information size of 170, use of 19-bit CRC, list-8 SCL decoding, and 16QAM.

Particularly, FIG. 13 illustrates comparison between performance "Natural" when an interleaver is not applied to a modulation process and performance for interleavers. In FIG. 13, "BR" denotes modulation performance using a scheme for bit-reversing indexes of output bits and "random" denotes modulation performance using a random interleaver for randomly mixing output bits of a polar code during every transmission. "LG_L_plus" denotes modulation performance using an interleaver for shifting a memory reading start position by one to the left according to a row when memory configuration is 5 (i.e., the number of columns of an interleaver is 5). "LG_R_plus" denotes modulation performance using an interleaver for shifting a memory reading start position by one to the right when memory configuration is 5 (i.e., the number of columns of an interleaver is 5). "LG_R_minus" denotes modulation performance using an interleaver for shifting a memory reading start position by one to the right when memory configuration is 3 (i.e., the number of columns of an interleaver is 3). "LG_L_minus" denotes modulation performance using an interleaver for shifting a memory reading start position by one to the left when memory configuration is 3 (i.e., the number of columns of an interleaver is 3).

When the number of columns is an odd number and the interleaver of the present disclosure for shifting a reading start position according to a row is used for modulation, positions of coded bits in symbols may be simply randomized. Modulation using the interleaver according to the present disclosure exhibits almost the same performance as modulation using a random interleaver. The interleaver according to the present disclosure is advantageous in that interleaver implementation is simple upon using a block interleaver according to the present disclosure in comparison with the random interleaver for interleaving coded bits using different random values during every transmission/modulation.

To show that modulation performance using the interleaver according to the present disclosure is almost the same as modulation performance using the random interleaver, modulation using a triangular interleaver proposed by Qualcomm incorporated (see 'R1-1708649, "Interleaver design for Polar codes," Qualcomm Incorporated, 3GPP TSG-RAN WG1 Meeting #89, Hangzhou, china, 15-19, May 2017"), which is the random interleaver, will be compared hereinbelow with performance of 4 interleaver schemes of the present disclosure (according to a combination of the number of columns (modulation order+1 or modulation order−1) and a shift direction (right or left). In FIG. 14, FIG. 15, and FIG. 16, numbers of columns other than columns of N, K, and R is dB in unit. FIG. 14, FIG. 15, and FIG. 16 illustrate results of a simulation for 16QAM.

FIG. 14 illustrates a required signal-to-noise ratio (SNR) (target BLER=$10^{-2}$) of mother code sizes to avoid an influence/effect of rate matching. That is, in FIG. 14, only output bits of the power of 2 are considered in order to avoid an effect of rate matching. The required SNR for satisfying the target BLER=$10^{-2}$ is represented in columns of FIG. 14. In FIG. 14, "Natural" denotes the case in which an interleaver is not applied to a modulation process, "Random" denotes the case in which a random interleaver is applied to the modulation process, "Triangle" denotes the case in which a triangular interleaver of Qualcomm is applied to the modulation process, "Left_plus_1" denotes the case of applying an interleaver in which the number of columns is 'modulation order+1' and a reading start position is shifted by 1 to the left according to a row to the modulation process, "Left_minus_1" denotes the case of applying an interleaver in which the number of columns is 'modulation order−1' and a reading start position is shifted by 1 to the left according to a row to the modulation process, Right_plus_1" denotes the case of applying an interleaver in which the number of columns is 'modulation order+1' and a reading start position is shifted by 1 to the right according to a row to the modulation process, and "Right_minus_1" denotes the case of applying an interleaver in which the number of columns is 'modulation order−1' and a reading start position is shifted by 1 to the right according to a row to the modulation process. For example, right cyclic shift value=1 in FIG. 12 is represented as "Right_minus_1" in FIG. 14. In FIG. 14, N denotes the size of a mother code, K denotes the number of information bits input to a polar code, and R denotes a code rate. In FIG. 14, cells filled with dots denote cells having a performance difference less than 0.1 dB between the triangular interleaver of Qualcomm and a best proposed interleaver of the present disclosure (i.e., an interleaver having the best performance among four combinations proposed in the present disclosure) and cells filled with slanted lines denote cells having a performance difference greater than 0.1 dB between the interleaver of Qualcomm and the proposed interleaver of the present disclosure. As illustrated in FIG. 14, best proposed scheme(s) of the present disclosure have performance similar to or slightly better than the triangular interleaver of Qualcomm. The interleaver of the present disclosure is advantageous in that there are cases in which the interleaver of the present disclosure has performance similar to the triangular interleaver of Qualcomm or even has better performance than the triangular interleaver of Qualcomm in spite of simpler structure than the triangular interleaver of Qualcomm and thus relatively easy implementation.

In this case, the proposed schemes may be selected according to K, R, or N. For example, when K=85 and N=512, Right_minus_1 may be used. If K and N are changed to K=170 and N=512 during next transmission, a scheme of shifting a start position during memory reading according to a row to the left, rather than to the right, may be used. Since a memory reading address may be easily changed, change of an interleaver scheme to be actually used for modulation in interleaver schemes of the present disclosure may be implemented without additional complexity. The number of columns of an interleaver may also be changed according to K, R, or N. That is, a combination having best performance for a shift value, a shift direction, and the number of columns according to a condition caused by K, R, or N may be used for modulation. If storage capacity etc. of a communication device for the shift value, the shift direction, and/or the number of columns is problematic, some subgroups for values of N, values of K, and/or values of R may be configured according to N, K, and/or R and, in a subgroup, the same shift value, the same shift direction, and/or the same number of columns may be used. For example, R=2/3 to 1/2 may belong to one subgroup.

The interleaver of the present disclosure may also be applied in consideration of a rate matching scheme. FIG. 15 illustrates a required SNR (target BLER=$10^{-2}$) according to an interleaver considering a bit-reversal shortening scheme. In FIG. 15, N, K, R, "Natural", "Random", "Triangle", "Left_plus_1", "Left_minus_1", "Right_plus_1", and "Right_minus_1" have the same meaning as those in FIG. 14. In FIG. 15, cells filled with dots denote cells having a performance difference less than 0.1 dB between the triangular interleaver of Qualcomm and the best proposed interleaver of the present disclosure and cells filled with slanted lines denote cells having a performance difference greater than 0.1 dB between the interleaver of Qualcomm and the proposed interleaver of the present disclosure.

In consideration of rate matching, the best proposed schemes of the present disclosure have performance similar to or slightly better than the triangular interleaver of Qualcomm, as illustrated in FIG. 15.

An interleaver may also be selected according to a specific condition instead of selecting the interleaver for each of values of K or each of values of M. FIG. 16 illustrates a required SNR for bit-reverse (BR) puncturing. In FIG. 16, N, K, R, "Natural", "Random", "Triangle", "Left_plus_1", "Left_minus_1", "Right_plus_1", and "Right_minus_1" have the same meaning as those in FIG. 14. In FIG. 16, cells filled with dots denote cells having a performance difference within 0.1 dB between the triangular interleaver of Qualcomm and the proposed interleaver of the present disclosure. If use of a part in which the required SNR is lowest is the specific condition, an interleaver corresponding to a cell filled with dots may be used for a modulation process. In this case, the best required SNR condition may differ according to R, K, or M or according to a subgroup of values of R, a subgroup of values of K, or a subgroup of values of M. Alternatively, the best required SNR condition may differ not only according to a subgroup determined only by one parameter (one of K, R, and M) but also according to a subgroup of K, R, and M or a subgroup consisting of two or more parameters among K, R, and M. For example, for a BR puncturing scheme, an interleaver of Right_plus_1 may be used regardless of K and M. When the interleaver of Right_plus_1 is not available, for example, when R=1/6 or 1/3, the interleaver of Left_plus_1 may be used and, when R=1/2, the interleaver of Right_minus_1 may be used. If some of cells corresponding to the specific condition are not cells having a difference within specific performance (e.g. cells filled with dots in FIG. 16) or cells having performance greater than a certain value (e.g. cells filled with slanted lines in FIG. 16), an interleaver, performance degradation of which is minimized among the proposed interleavers of the present disclosure, may also be used in the modulation process.

Since the interleaver may vary in performance according to a rate matching scheme, the type of the interleaver or the specific condition used in the modulation process may vary according to the rate matching scheme used.

Up to now, a method of shifting a reading start position as a read row is changed has been described. It is possible to change a stored start position when storing coded bits in a memory. For example, referring to FIG. 12(a), a writing start position may be shifted by 1 as a column is changed instead of sequentially writing the coded bits starting from the first row of each column in the memory. For example, a writing operation may be performed such that, in the first column, the coded bits are written starting from the first row, whereas, in the second column, the remaining coded bits which are not used in the first column are written starting from the second row. In the third column, the remaining coded bits which are not used in the first and second columns may be sequentially written starting from the third row. That is, the memory writing operation may be performed similarly to the above-described memory reading method of the present disclosure. For example, the memory writing method of cyclically shifting a writing start position upward or downward by a positive integer (e.g., 1) as a column is changed with respect to 'modulation order±odd number' columns may be used. In this case, however, the reading start position may be the same for all rows.

Alternatively, the number of columns of the memory may be fixed to a value of 5 or 3 regardless of the modulation order. In this case, the number of rows is ceil(M/'number of columns'), where M represents the length of coded bits. A start read address may be shifted to the right and may be shifted to the left. When a shift value>0 is applied as compared to the case in which the shift value is 0, not only an interleaving effect caused by the odd number of columns but also an additional interleaving effect through memory reading may be obtained. Therefore, the present disclosure has the advantage that the interleaving effect is closer to the random interleaver.

Information about the shift value, the shift direction, and/or the number of columns may be dynamically indicated through DCI or UCI or may be semi-statically indicated through RRC, according to a service scenario.

Figure 17:
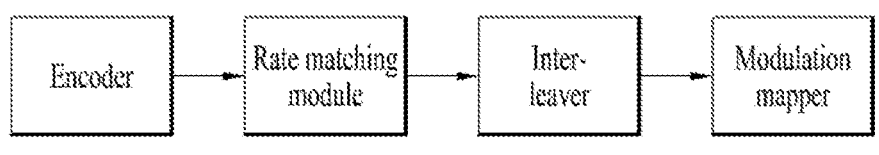
FIG. 17 illustrates coding chains according to present disclosure.
Figure 17:
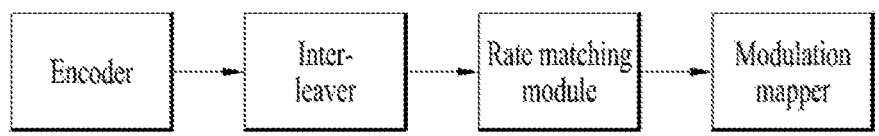

FIG. 17 illustrates coding chains according to the present disclosure. Particularly, FIG. 17(a) illustrates a coding chain applying an interleaver after rate matching. FIG. 17(b) illustrates a coding chain applying an interleaver before rate matching (e.g., puncturing or shortening).

When M is the length of coded bits (i.e., the number of coded bits) to be actually transmitted, M=N. Herein, N is the size of a mother code an encoder. Therefore, the size of the interleaver is desirably designed to be equal to M. An interleaver of a BR scheme has the following problems if M and N are not equal. For example, when N=8, if indexing starting from 0 is sequentially assigned to output bits, bit reverse values for the output bits 0, 1, 2, . . . , 6, 7 are 0, 4, 2, 6, 1, 5, 3, 7. When the number of bits to be actually transmitted is M=6, available bit indexes are 0 to 5. If 6 bits are selected from the bit-reversed output bits starting from the front, the output bits 0, 4, 2, 6, 1, 5 are selected and "6" which is not actually available is included. This problem may be solved such that bit reverse is designed first using a minimum of N greater than M and then excludes values equal to or greater than M (values greater than M−1 if an index starts at 0 or values greater than M if the index starts at 1). That is, when M=6, a pattern of 0, 4, 2, 1, 5, 3 may be used as the interleaver. The same principle may be equally applied not only to the BR scheme but also any other scheme having values equal to or greater than M (values greater than M−1 if an index starts at 0 or values greater than M if the index starts at 1).

In FIG. 17(b), the size of the interleaver is advantageously fixed always to N.

Figure 18:
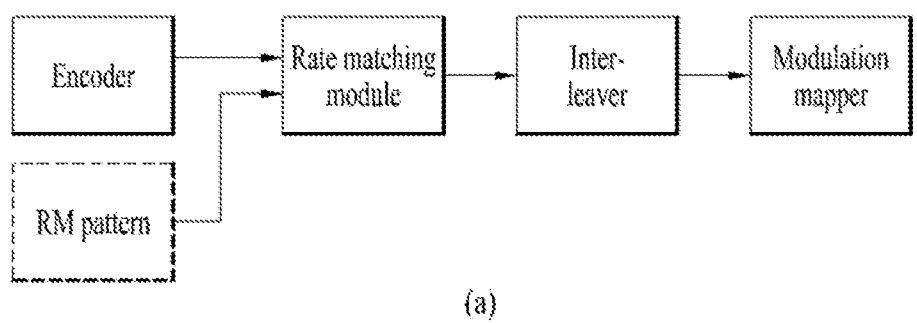
FIG. 18 illustrates methods of applying a rate matching pattern to a coding chain.
Figure 18:
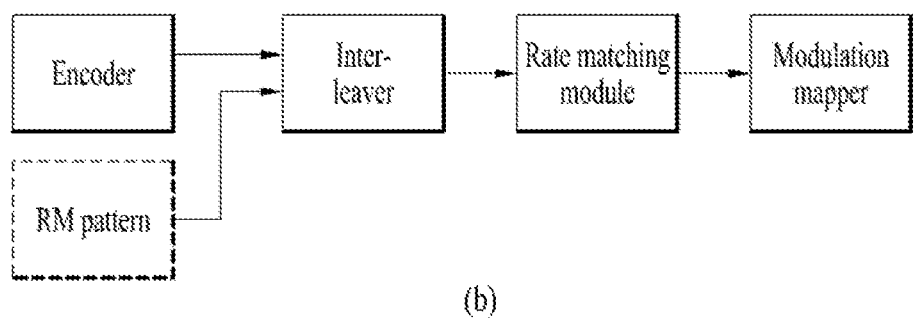
Figure 18:
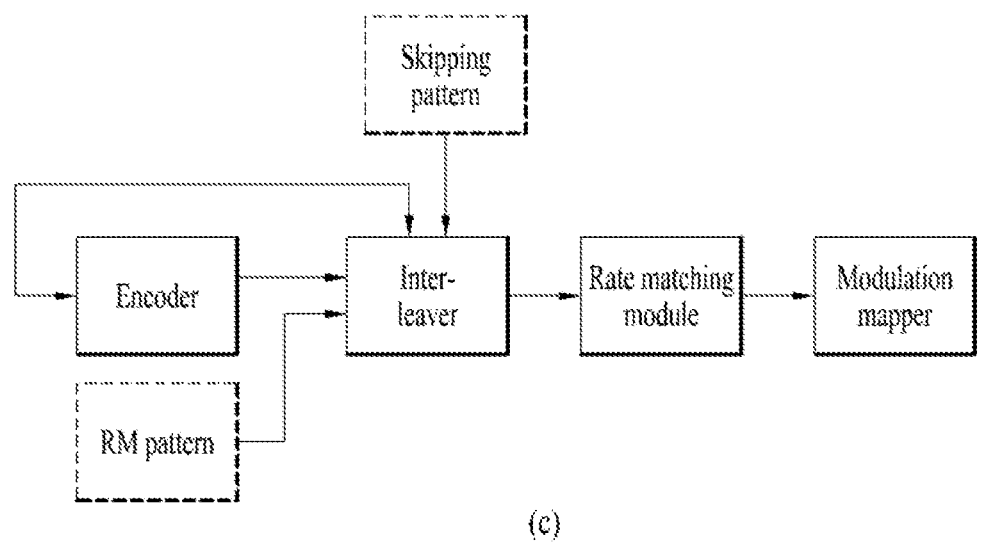

FIG. 18 illustrates methods of applying a rate matching (RM) pattern to a coding chain. In particular, FIG. 18(a) explains a method of applying the rate matching pattern to a coding chain scheme applying an interleaver after rate matching, FIG. 18(b) explains a method of applying the rate matching pattern (particularly, a puncturing pattern) to the coding chain scheme applying the interleaver before rate matching, and FIG. 18(c) explains a method of applying the rate matching pattern (particularly, a shortening pattern) to the coding chain scheme applying the interleaver before rate matching.

Rate matching for a polar code may be broadly divided into puncturing and shortening. The puncturing scheme indicates that a coded bit is not transmitted so that a receiver may receive a received signal in an unknown state. Shortening indicates that a coded bit is not transmitted so that the receiver may receive a received signal in a known state. During actual transmission of one coded bit, the two schemes may also be simultaneously applied. That is, the coded bit may be punctured or shortened for rate matching. Since interleaving for coded bits is performed, a puncturing/shortening pattern should pass through the same interleaving pattern in order to puncture/shorten the same output position of the polar code. That is, in the coding chain as illustrated in FIG. 17(a), rate matching may be applied without changing a polar encoding process as illustrated in FIG. 18(a). In other words, in the coding chain as illustrated in FIG. 17(a), a rate matching pattern may be immediately applied to rate matching without changing the polar encoding process as illustrated in FIG. 18(a). In the coding chain as illustrated in FIG. 17(b), a scheme of applying the same interleaving pattern to a puncturing/shortening pattern may be used as illustrated in FIG. 18(b).

For example, an interleaver pattern for output bit indexes of 0, 1, 2, 3, 4, 5, 6, 7 is 4, 5, 6, 7, 0, 1, 2, 3. If punctured indexes (i.e., a puncturing pattern) among output stage nodes of an encoder are 1 and 3, a puncturing pattern passing through an interleaver is 5, 7. Accordingly, puncturing may be performed upon the same output node that is rate-matched in FIG. 18(a). That is, the puncturing pattern is a pattern of puncturing indexes 1 and 3 among the output nodes (i.e., output positions) and output bits of output nodes 0, 1, 2, 3, 4, 5, 6, 7 are 0, 1, 2, 3, 4, 5, 6, 7, respectively, since puncturing is performed upon output bits 0, 1, 2, 3, 4, 5, 6, 7 in FIG. 18(a) according to the puncturing pattern, rate matching output becomes 0, 2, 4, 5, 6, 7. In FIG. 18(b), since outputs of an interleaver for output bits 0, 1, 2, 3, 4, 5, 6, 7 are 4, 5, 6, 7, 0, 1, 2, 3 and puncturing positions 1 and 3 according to the puncturing pattern becomes positions 5 and 7 by the interleaving pattern, positions 5 and 7 among the outputs '4, 5, 6, 7, 0, 1, 2, 3' of the interleaver are punctured so that output bits become '4, 5, 6, 7, 0, 2'.

Shortening additionally requires a process (i.e., skipping) of changing a node value at an input stage of an encoder to a known value. If a puncturing pattern and a skipping pattern are passed through an interleaver as illustrated in FIG. 18(c), shortening may be performed upon the same output node as in FIG. 18(a). More specifically, when the rate matching pattern (i.e., shortening pattern) and the skipping pattern are passed through the interleaver as illustrated in FIG. 18(c), shortening may be performed upon the same coded bit node (i.e., output stage node) as in FIG. 18(a) and skipping may be performed upon the same input bit node (i.e., input stage node) as in the FIG. 18(a).

In a 3GPP based communication system, an aggregation level (AL) represents the number of control channel elements (CCEs) capable of being used to transmit a physical DL control channel (see 3GPP TS 36.211, 3GPP TS 36.213, 3GPP 38.211, and 3GPP TS 38.213). An interleaver size may be determined to be the same as the size of bits (e.g., the number of bits to be actually transmitted) after rate matching of coded bits. However, since latency increases as the interleaver size increases, the interleaver size may be determined to be smaller than a rate-matched bit size or a coded bit size and then interleaving (or multiple interleavers) may be applied several times instead of adjusting the interleaver size to the rate-matched bit size or coded bit size. In this case, an effect of reducing latency is obtained by configuring interleavers in parallel. For example, when AL=2, the interleaver size may be determined to be the same as a maximum of two CCEs. However, it is possible to perform interleaving twice or simultaneously use two interleavers, after determining the interleaver size as one CCE. Similarly, when the AL is increased (e.g., to 4 or 8), interleaving may be performed several times after determining the interleaver size as a minimum size with which an interleaving effect occurs.

To use such parallel interleavers, coded bits need to be segmented into bits of a size corresponding to the interleaver size and the length of the segmented coded bits may be determined to be suitable for an interleaver characteristic (e.g., interleaver depth, i.e., interleaver size etc.). For example, when the interleaver length is a and b, coded bits may be segmented to have the same size or each segmented coded bit size may be determined to be suitable for the interleaver characteristic as a value close to a multiple of a or a multiple of b, for example, based on a multiple of the interleaver depth. In the present disclosure, interlacing may be performed upon output of each interleaver in order to increase an interleaving effect. Output bits may be interlaced in order of first bits and second bits of respective interleavers. For example, when output bits of an interleaver a are positioned in order of a1, a2, a3, and a4 and output bits of an interleaver b are positioned in order of b1, b2, b3, and b4, outputs of parallel interleaving using the interleavers a and b may be interlaced as a1, b1, a2, b2, a3, b3, a4, and b4.

Figure 19:
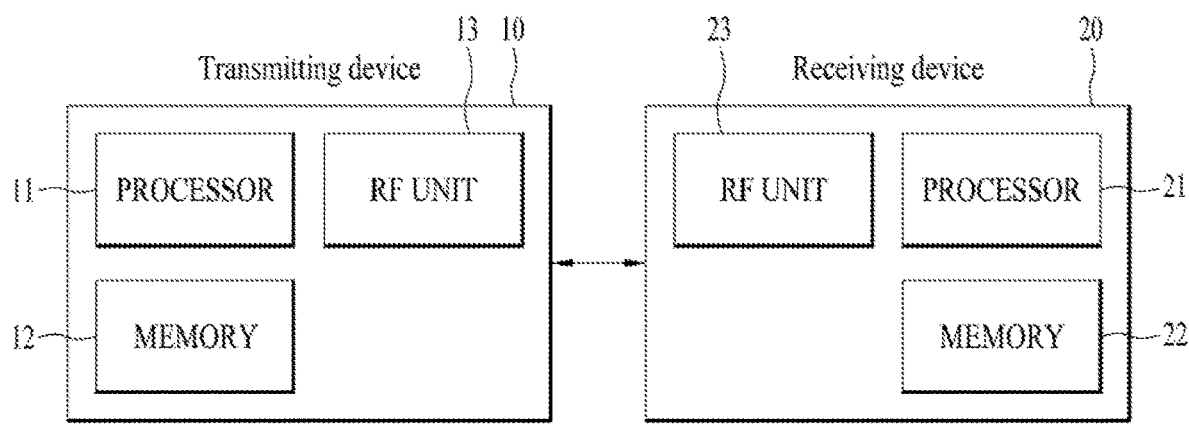
FIG. 19 is a block diagram illustrating elements of a transmitting device 10 and a receiving device 20 for implementing the present disclosure.

FIG. 19 is a block diagram illustrating elements of a transmitting device 10 and a receiving device 20 for implementing the present disclosure.

The transmitting device 10 and the receiving device 20 respectively include radio frequency (RF) units 13 and 23 capable of transmitting and receiving radio signals carrying information, data, signals, and/or messages, memories 12 and 22 for storing information related to communication in a wireless communication system, and processors 11 and 21 operationally connected to elements such as the RF units 13 and 23 and the memories 12 and 22 to control the elements and configured to control the memories 12 and 22 and/or the RF units 13 and 23 so that a corresponding device may perform at least one of the above-described examples of the present disclosure.

The memories 12 and 22 may store programs for processing and controlling the processors 11 and 21 and may temporarily store input/output information. The memories 12 and 22 may be used as buffers.

The processors 11 and 21 generally control the overall operation of various modules in the transmitting device and the receiving device. Especially, the processors 11 and 21 may perform various control functions to implement the present disclosure. The processors 11 and 21 may be referred to as controllers, microcontrollers, microprocessors, or microcomputers. The processors 11 and 21 may be implemented by hardware, firmware, software, or a combination thereof. In a hardware configuration, application specific integrated circuits (ASICs), digital signal processors (DSPs), digital signal processing devices (DSPDs), programmable logic devices (PLDs), or field programmable gate arrays (FPGAs) may be included in the processors 11 and 21. Meanwhile, if the present disclosure is implemented using firmware or software, the firmware or software may be configured to include modules, procedures, functions, etc. performing the functions or operations of the present disclosure. Firmware or software configured to perform the present disclosure may be included in the processors 11 and 21 or stored in the memories 12 and 22 so as to be driven by the processors 11 and 21.

The processor 11 of the transmitting device 10 performs predetermined coding and modulation for a signal and/or data scheduled to be transmitted to the outside by the processor 11 or a scheduler connected with the processor 11, and then transfers the coded and modulated data to the RF unit 13. For example, the processor 11 converts a data stream to be transmitted into K layers through demultiplexing, channel coding, scrambling, and modulation. The coded data stream is also referred to as a codeword and is equivalent to a transport block which is a data block provided by a MAC layer. One transport block (TB) is coded into one codeword and each codeword is transmitted to the receiving device in the form of one or more layers. For frequency up-conversion, the RF unit 13 may include an oscillator. The RF unit 13 may include $N_t$ (where $N_t$ is a positive integer) transmit antennas.

A signal processing process of the receiving device 20 is the reverse of the signal processing process of the transmitting device 10. Under control of the processor 21, the RF unit 23 of the receiving device 20 receives radio signals transmitted by the transmitting device 10. The RF unit 23 may include $N_r$ (where $N_r$ is a positive integer) receive antennas and frequency down-converts each signal received through receive antennas into a baseband signal. The processor 21 decodes and demodulates the radio signals received through the receive antennas and restores data that the transmitting device 10 intended to transmit.

The RF units 13 and 23 include one or more antennas. An antenna performs a function for transmitting signals processed by the RF units 13 and 23 to the exterior or receiving radio signals from the exterior to transfer the radio signals to the RF units 13 and 23. The antenna may also be called an antenna port. Each antenna may correspond to one physical antenna or may be configured by a combination of more than one physical antenna element. The signal transmitted from each antenna cannot be further deconstructed by the receiving device 20. An RS transmitted through a corresponding antenna defines an antenna from the view point of the receiving device 20 and enables the receiving device 20 to derive channel estimation for the antenna, irrespective of whether the channel represents a single radio channel from one physical antenna or a composite channel from a plurality of physical antenna elements including the antenna. That is, an antenna is defined such that a channel carrying a symbol of the antenna can be obtained from a channel carrying another symbol of the same antenna. An RF unit supporting a MIMO function of transmitting and receiving data using a plurality of antennas may be connected to two or more antennas.

In FIG. 19, the transmitting device 10 and the receiving device 20 are separately illustrated. However, the processor 11, the memory 12, and the RF unit 13 in the transmitting device 10 may be configured to perform the operation of the receiving device 20 as well, and the processor 21, the memory 22, and the RF unit 23 in the receiving device 20 may be configured to perform the operation of the transmitting device 10 as well. Alternatively, each of the RF unit of the transmitting device 10 and the RF unit 23 of the receiving device 20 may be referred to as a transceiver.

The transmitting device 10 may be configured to include a polar encoder according to present disclosure and the receiving device 20 may be configured to include a polar decoder according to the present disclosure. For example, the processor 11 of the transmitting device 10 may be configured to perform polar encoding according to the present disclosure and the processor 21 of the receiving device 20 may be configured to perform polar decoding according to the present disclosure. That is, the polar encoder according to the present disclosure may be configured as a part of the processor 11 of the transmitting device 10 and the polar decoder according to the present disclosure may be configured as a part of the processor 21 of the receiving device 20. Modules of FIG. 17(a), 17(b), 18(a), 18(b), or 18(c) may be configured as a part of the processor 11 of the transmitting device 10 or may be configured by being controlled by the processor 11.

As described above, the detailed description of the preferred implementation examples of the present disclosure has been given to enable those skilled in the art to implement and practice the disclosure. Although the disclosure has been described with reference to exemplary examples, those skilled in the art will appreciate that various modifications and variations can be made in the present disclosure without departing from the spirit or scope of the disclosure described in the appended claims. Accordingly, the disclosure should not be limited to the specific examples described herein, but should be accorded the broadest scope consistent with the principles and novel features disclosed herein.

INDUSTRIAL APPLICABILITY

Examples of the present disclosure may be used for a processing chip connected to or mounted in a BS, a UE, or a communication device in a wireless communication system, or for other equipment.

The invention claimed is:

1. A method of transmitting information by a transmitting device in a wireless communication system, the method comprising:
encoding the information using a polar code to produce a first bit sequence;
inputting bits of the first bit sequence to an interleaver to output a second bit sequence;
modulating the second bit sequence to modulation symbols based on $2^Q$-quadrature amplitude modulation ($2^Q$-QAM), where Q is a modulation order and is a positive integer multiple of 4; and
transmitting the modulation symbols,
wherein the interleaver has columns 0 to C−1, where C is an odd number,
wherein the bits of the first bit sequence are stored column-wise in the interleaver, starting from a column 0 of the interleaver, and
wherein the interleaver outputs bits stored in a row n of the interleaver by cyclically reading out row-wise the bits stored in the row n starting from a column k and outputs bits stored in a row n+1 of the interleaver by cyclically reading out row-wise the bits stored in the row n+1 starting from a column k+a, where a is an integer other than 0.

2. The method of claim 1, wherein the number C of columns in the interleaver is 'Q−b' or 'Q+b', where b is an odd number not greater than Q.

3. The method of claim 1, wherein the number R of rows in the interleaver is ceil(M/C), where M is the length of the first bit sequence.

4. The method of claim 1, wherein the first bit sequence is obtained by applying rate matching to an output bit sequence of the polar code.

5. The method of claim 1, further comprising:
applying rate matching to the second bit sequence, wherein the rate-matched second bit sequence is modulated to the modulation symbols.

6. A transmitting device for transmitting information in a wireless communication system, the transmitting device comprising:
a transceiver;
a processor;
a memory storing at least one program that, when executed, causes the processor to perform operations comprising:
encoding, via an encoder, the information using a polar code to produce a first bit sequence;
outputting, via an interleaver, a second bit sequence based on bits of the first bit sequence;
modulating, via a modulation mapper, the second bit sequence to modulation symbols based on $2^Q$-quadrature amplitude modulation ($2^Q$-QAM), where Q is a modulation order and is a positive integer multiple of 4; and
transmitting, via the transceiver, the modulation symbols,
wherein the interleaver has columns 0 to C−1, where C is an odd number,
wherein the bits of the first bit sequence are stored column-wise in the interleaver, starting from a column 0 of the interleaver, and
wherein the interleaver outputs bits stored in a row n of the interleaver by cyclically reading out row-wise the bits stored in the row n starting from a column k and output bits stored in a row n+1 of the interleaver by cyclically reading out row-wise the bits stored in the row n+1 starting from a column k+a, where a is an integer other than 0.

7. The transmitting device of claim 6, wherein the number C in columns of the interleaver is 'Q−b' or 'Q+b', where b is an odd number not greater than Q.

8. The transmitting device of claim 6, wherein the number R of rows in the interleaver is ceil(M/C), where M is the length of the first bit sequence.

9. The transmitting device of claim 6, wherein the operations further comprise: rate-matching, via a rate matching module, the first bit sequence and inputting the rate-matched first bit sequence to the interleaver.

10. The transmitting device of claim 6, wherein the operations further comprise: rate-matching, via a rate matching module, the second bit sequence and inputting the rate-matched second bit sequence to the modulation mapper.

* * * * *